United States Patent [19]
Iwasaki et al.

[11] Patent Number: 6,050,768
[45] Date of Patent: Apr. 18, 2000

[54] AUTOMATIC CARRIER CONTROL METHOD IN SEMICONDUCTOR WAFER CASSETTE TRANSPORTATION APPARATUS

[75] Inventors: Junji Iwasaki; Junichi Katsube; Yasushi Itami, all of Hyogo, Japan

[73] Assignee: Mitsubishi Denki Kabushiki Kaisha, Tokyo, Japan

[21] Appl. No.: 09/035,818

[22] Filed: Mar. 6, 1998

[30] Foreign Application Priority Data

Aug. 8, 1997 [JP] Japan .................................. 9-214916

[51] Int. Cl.[7] ...................................................... G06F 19/00
[52] U.S. Cl. ..................... 414/222.01; 414/935; 414/940; 414/800; 364/478.01
[58] Field of Search ..................................... 414/935, 936, 414/940, 222.01, 222.13, 800; 364/478.01, 478.06

[56] References Cited

U.S. PATENT DOCUMENTS

| | | | |
|---|---|---|---|
| 4,936,734 | 6/1990 | Osada | 414/940 |
| 4,974,166 | 11/1990 | Maney et al. | |
| 5,570,990 | 11/1996 | Bonora et al. | 414/940 |
| 5,751,581 | 5/1998 | Tau et al. | 364/478.13 |

FOREIGN PATENT DOCUMENTS

| | | |
|---|---|---|
| 2735290 A1 | 2/1978 | Germany . |
| 53-020263 | 2/1978 | Japan . |
| 53-020264 | 2/1978 | Japan . |
| 53-020267 | 2/1978 | Japan . |
| 1-267202 | 10/1989 | Japan . |
| 4-67211 | 3/1992 | Japan . |
| 6-196544 | 7/1994 | Japan . |

*Primary Examiner*—Gregory A. Morse
*Attorney, Agent, or Firm*—McDermott, Will & Emery

[57] ABSTRACT

According to an automatic carrier control method of a semiconductor wafer cassette transportation apparatus having high semiconductor wafer cassette transportation ability, an automatic carrier carries a semiconductor wafer cassette to an automatic carrier related inlet port of a stocker under control of a host computer. The automatic carrier confirms whether a semiconductor wafer cassette is left on the inlet port. If there is no preceding semiconductor wafer cassette, a semiconductor wafer cassette is placed on the inlet port. If there is a preceding semiconductor wafer cassette, the automatic carrier waits for a predetermined time at inlet port for the preceding semiconductor wafer cassette to be removed. When the preceding semiconductor wafer cassette is not removed at an elapse of a predetermined time, an error is issued to the automatic carrier.

6 Claims, 17 Drawing Sheets

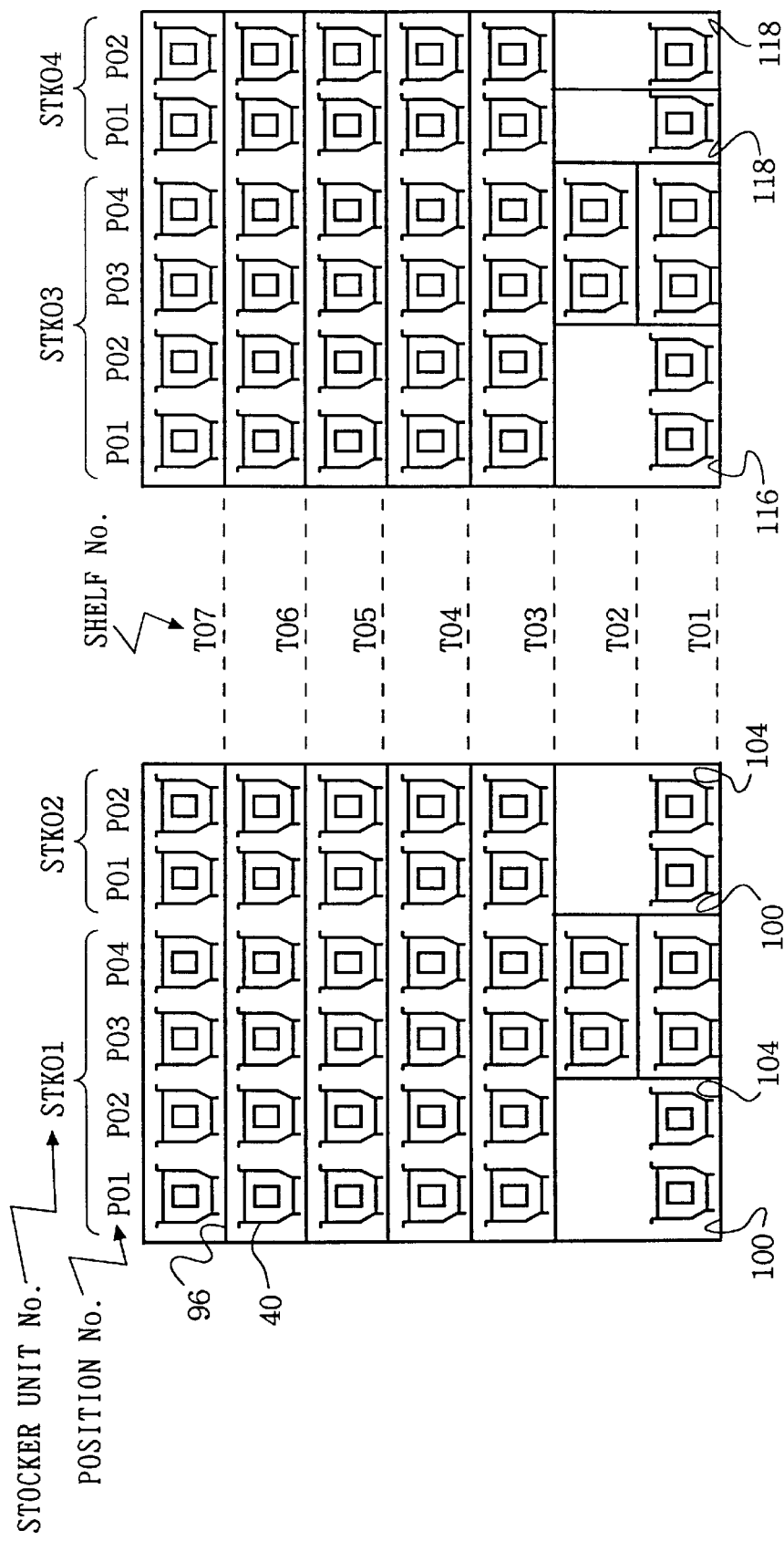

6,050,768

AUTOMATIC CARRIER CONTROL METHOD IN SEMICONDUCTOR WAFER CASSETTE TRANSPORTATION APPARATUS

BACKGROUND OF THE INVENTION

1. Field of the Invention

The present invention relates to an automatic carrier control method in a semiconductor wafer cassette transportation apparatus. More particularly, the present invention relates to a control method of an automatic carrier in a semiconductor wafer cassette transportation apparatus for improving semiconductor wafer cassette transportation ability.

2. Description of the Background Art

Referring to FIGS. 15 and 16, a conventional semiconductor wafer cassette transportation apparatus 230 includes processing apparatuses 32 and 34 receiving semiconductor wafers in the unit of a cassette 232 to apply a fabrication process of a semiconductor integrated circuit, a stocker 234 for storing a plurality of cassettes 232, an automatic carrier 38 for carrying out a transportation task of a cassette 232 between processing apparatus 32/34 and stocker 234, and an inter-stocker transport device 42 for conveying a cassette 232 between a plurality of stockers 234 arranged along the fabrication process line.

Processing apparatus 32/34 uses stocker 234 as a storage site of semiconductor wafer cassette 232 before and after the fabrication process. Two automatic carriers 38 are engaged in the transportation task of cassette 232 between processing apparatus 32/34 and stocker 234. For the sake of convenience, inter-stocker transport device 42 is indicated in a cut-off manner in the drawing. In practice, inter-stocker transport device 42 is arranged in a circulating manner with a plurality of stockers 234 disposed adjacent thereto. Respective groups of processing apparatus 32/34 and automatic carrier 38 correspond to each of other stockers 234.

Referring particularly to FIG. 16, semiconductor wafer cassette transportation apparatus 230 further includes a host computer 50 for controlling processing apparatuses 32 and 34, stocker 234, automatic carrier 38, and inter-stocker transport device 42, and a communication cable 58 for providing connection between various devices and host computer 50.

Host computer 50 includes a main body 52 to carry out a calculation process, a terminal 54 to enter fabrication standard data of a product, and a plurality of operator's terminals 56 provided at the line.

A stocker controller 64 which is an element of stocker 234 drives other structural elements of stocker 234 to carry out a predetermined task according to a task instruction from host computer 50 via communication cable 58. An automatic carrier controller 60 which is an element of automatic carrier 38 drives other structural elements of automatic carrier 38 to carry out a predetermined task according to a task instruction from host computer 50 via communication cable 58. Communication between automatic carrier controller 60 and automatic carrier 38 is carried out by radio via a control station communication unit 62. An inter-stocker transport device controller 66 which is an element of inter-stocker transport device 42 drives a structural element of inter-stocker transport device 42 and also a structural element of stocker 234 via communication cable 58 to carry out a predetermined task according to a task instruction sent from host computer 50 via communication cable 58.

Semiconductor wafer 70 and semiconductor wafer cassette 232 transferred by semiconductor wafer cassette transportation apparatus 230 and a conventional ID card 240 attached to semiconductor wafer cassette 232 will be described hereinafter with reference to FIGS. 17A–17C. A plurality of semiconductor integrated circuits (not shown) are produced on a semiconductor wafer (referred to as "wafer" hereinafter) 70. Semiconductor wafer cassette (referred to as "cassette" hereinafter) 232 is the minimum unit of storing and transporting a plurality of wafers 70. An ID card 240 is attached to cassette 232. ID card 240 includes information associated with cassette 232 and wafer 70 stored therein. Some of the information thereof can be provided on a display unit 74. ID card 240 can have the information partially rewritten via communication unit 76 with respect to an external control system that will be described afterwards. Also, the stored information can be reported in a non-contact manner. A communication unit 76 is attached at the front face of ID card 240. FIGS. 17A and 17B show a transversal orientation and a vertical orientation, respectively, of cassette 232 to which ID card 240 is attached. More specifically, in the transversal orientation, wafers 70 are stored with the disk plane in the vertical direction. In the vertical orientation, wafers 70 are stored with the disk plane in the horizontal direction. FIG. 17C shows ID card 240 in detail.

The details of processing apparatuses 32 and 34, stocker 234, automatic carrier 38, and inter-stocker transport device 42 will be described hereinafter with reference to the drawings.

Referring to FIG. 10, processing apparatus 32 includes a main body 170 for applying a semiconductor integrated circuit fabrication process on every one or a plurality of wafers 70, two cassette stages 172 receiving cassette 232 to be processed in the unit of one cassette, and a automatic carrier-directed communication unit 174 for providing information of the state of cassette stage 72 towards automatic carrier 38 to confirm whether any improper cassette 232 is mounted on cassette stage 172 before automatic carrier 38 places a cassette 232 not yet processed on cassette stage 172, or whether cassette 232 subjected to a process is properly mounted on cassette stage 172 before that cassette 232 is taken away.

Referring to FIG. 11, processing apparatus 34 includes a main body 180 for applying a semiconductor integrated circuit fabrication process on every one or a plurality of wafers 70, two cassette stages 182 receiving cassette 232 to be processed in the unit of 2 cassettes, and an automatic carrier-directed communication unit 174 for providing information of the state of cassette stage 182 towards automatic carrier 38 to confirm whether any improper cassette 232 is placed on cassette stage 182 before automatic carrier 38 places a cassette 232 to be processed on cassette stage 182, or whether cassette 232 subjected to a process is properly mounted on cassette stage 182 before that cassette 232 is to be taken away.

Stocker 234 will be described with reference to FIGS. 18–20. The operation side face of stocker 234 with respect to automatic carrier 38 and an opposite side face thereof are respectively shown in FIGS. 18 and 19. FIG. 20 shows in detail an inlet port 260 for manual input viewed from arrow A of FIG. 19. These figures are drawn with a stocker panel 94 which is the external panel partially cut away so that the interior can be shown. Stocker 234 includes a stocker shelf 96 on which a plurality of cassettes 232 can be mounted in transversal orientation. A storage site for a large number of cassettes 232 is acquired by stacking a plurality of cassettes 232 on respective stocker shelves 96 in the vertical direction. Stocker 234 includes a port 98 which is a portion of stocker shelf 96 and provided for the entry or exit of a cassette 232 conveyed by inter-stocker transport device 42, an inlet port 260 which is a portion of stocker shelf 96 and provided for an operator (not shown) to enter a cassette 232, an outlet port 262 which is a portion of stocker shelf 96 and provided for an operator to take away a cassette 232, an outlet port 252 for automatic carrier 38 to receive cassette 232, an outlet delivery port 100 which is a portion of stocker shelf 96 to transfer cassette 232 to outlet port 252, an inlet port 254 through which cassette 232 is input from automatic carrier 38, an inlet delivery port 104 which is a portion of stocker shelf 96 and on which cassette 232 from inlet port 254 is placed, a stocker crane 80 arranged between stocker shelves 96 for the transportation task of cassette 232 between a cassette storage site on stocker shelf 96 and respective ports of stocker shelf 96, a transfer device 82 for receiving cassette 232 from the carriage of inter-stocker transport device 42 and placing the same on port 98, or for providing cassette 232 from port 98 onto an empty carriage of inter-stocker transport device 42, and a forward translate device 250 for transferring cassette 232 from port 100 to port 252, or from port 254 to port 104.

Stocker crane 80, transfer device 82, and forward translate device 250 carry out a transportation task in the unit of 1 cassette, 2 cassettes, and 1 cassette, respectively. The number of cassettes that can be mounted at port 98, inlet port 260, outlet port 262, outlet delivery port 100, inlet delivery port 104, outlet port 252 and inlet port 254 is 2 cassettes, 1 cassette, 1 cassette, 1 cassette, 1 cassette, 1 cassette, and 1 cassette, respectively. Two forward translate devices 250 are provided. Accordingly, two outlet ports 252, two inlet ports 254, two outlet delivery ports 100, and two inlet delivery ports 104 are provided. Also, two inlet ports 260 and two outlet ports 262 for manual input/output are provided.

As shown in FIG. 20, an ID card reader/writer 270 is attached at each inlet port 260. Since ID card communication unit 76 is located at the front face of ID card 240, ID card reader/writer 270 must be provided corresponding to the front face of ID card 240. If ID card reader/writer 270 is disposed so that the front face of ID card 240 faces the operation plane side of the operator, cassette 232 cannot be easily output due to the obstacle of ID card reader/writer 270. Therefore, cassette 232 on inlet port 260 for manual input is oriented so that the front face of ID card 240 attached to cassette 232 is 90° rightwards with respect to the operation plane side of the operator. Since stocker crane 80 cannot modify the orientation of cassette 232, the orientation of cassette 232 on stocker shelf 96 is identical to that of cassette 232 on inlet port 260. However, the orientation of cassette 232 placed at outlet port 252 and inlet port 254 is arranged so that ID card 240 directly faces the task plane for automatic carrier 38 to facilitate the transfer. Therefore, forward translate device 250 must also alter the orientation of cassette 232 during the transfer.

Stocker 234 further includes an operation panel 121 used by the operator during entry/exit of cassette 232 through inlet port 260/outlet port 262.

Referring to FIG. 8, automatic carrier 38 includes a carriage 140 that runs according to the guidance of a guide tape 156 that is affixed to the floor, a carrier communication unit 142 for transferring information to and from control station communication unit 62 of automatic carrier controller 60, an arm 144, a hand 146, and a hand claw 148 for performing a carry task of cassette 232, four transfer mounts 150 for maintaining cassette 40 taken from processing apparatus 32/34 or from stocker 234 in the vertical orientation during travel, an operation panel 152 to transfer information to and from the operator, and a bumper 154 for detecting an obstacle to cease the current task.

Referring to FIG. 9, inter-stocker transport device 42 includes a travel rail 160 forming a loop, a carriage 162 moving in a constant direction on travel rail 160 for conveying not more than two cassettes 40, and a pendant 232 for hanging travel rail 160 from the ceiling.

A conventional method of controlling semiconductor wafer cassette transportation apparatus 230 will be described hereinafter. First, (1) the control method of a processed cassette 232 from processing apparatus 32/34 being carried by automatic carrier 38 into stocker 234, and then conveyed by inter-stocker transport device 42 to the next stocker 234 will be described. Then, (2) the control method of a cassette 232 to be processed being carried from a stocker 234 of the preceding stage into a stocker 234, and then output therefrom according to a request from processing apparatus 32/34 to be carried thereto by automatic carrier 38 will be described. Finally, (3) the control method of entry through inlet port 260 for manual input and exit through outlet port 262 for manual output will be described.

Control Method (1)

Automatic carrier related inlet port 254 and for inter-stocker transport device related port 98 are both empty when the power of stocker 234 is turned on and initialization is completed. A report is provided to host computer 50 via communication cable 58 that each port can receive a cassette 232. Upon receiving the port available information, host computer 50 determines whether the transportation task of cassette 232 into stocker 234 using automatic carrier 38 and inter-stocker transport device 42 is possible or not by the received port available information without detecting the stock status of cassette 232 in stocker 234.

Under the above state, processing apparatus 32/34 sends to host computer 50 via communication cable 58 a hand-over request of processed cassette 232 subjected to the semiconductor integrated circuit fabrication process. Processing apparatus 32/34 requests the cassette to be handed over in the unit of one cassette or in the unit of a plurality of cassettes. In response to this hand-over request, host computer 50 provides a transportation task instruction immediately to automatic carrier 38 via communication cable 58 since the available information of inlet port 254 for automatic carrier 38 is reported from stocker 234 in advance. The available inlet port 254 is determined corresponding to each of processing apparatuses 32 and 34. The data thereof is provided to host computer 50 in advance through terminal 54. Host computer 50 must send a transportation task instruction in the unit of 1 cassette to automatic carrier 38 even when a hand-over request in the unit of 2 cassettes is provided from processing apparatus 32/34 since entry of a cassette through inlet port 254 is carried out only by 1 cassette at a time.

Automatic carrier controller 60 receiving the transportation task instruction of one cassette from host computer 50 assigns the task to the most appropriate one of the plurality of automatic carriers 38 so as to execute a transportation task by communication with the main body through radio by means of control station communication unit 62 and carrier communication unit 142. This transportation task is set forth in the following. First, carriage 140 heads for processing apparatus 32/34 from which a cassette is to be unloaded, i.e., the source of transportation (referred to as "source" hereinafter) according to guide tape 152 affixed to the floor at the standby site. At the site of processing apparatus 32/34, automatic carrier 38 confirms whether there is a cassette 232 at the relevant cassette stage 172/182 via automatic carrier-directed communication unit 174. Then, arm 144, hand 146 and hand claw 148 are driven to take and place onto transfer mount 150 a relevant cassette 232 from cassette stage 172/182. Following this mounting task, carriage 140 moves from the site of source processing apparatus 32/34 towards a designated inlet port 254 of a stocker 234 to which a cassette is to be loaded, i.e., the destination of transportation (referred to as "destination" hereinafter).

Arriving at the destination stocker 234, automatic carrier 38 places cassette 232 on transfer mount 150 onto inlet port 254 in a sequence opposite to that described above. Before placing cassette 232 at the designated inlet port 254, automatic carrier 38 confirms whether there is no improper cassette 232 at inlet port 254 via carrier-directed communication unit 102 and immediately issues an error when there is an improper cassette 232. This error is based on the determination that another cassette 232 on the same port implies an abnormal state since cassette 232 is carried according to the empty information of inlet port 254 from stocker 234. When all the designated tasks are completed, automatic carrier controller 60 sends a task complete report to host computer 50 via communication cable 58.

Upon receiving a task complete report from automatic carrier 38, host computer 50 sends to stocker 234 an entry task instruction of cassette 232 through inlet port 254. In response to this entry task instruction sent via communication cable 58, stocker controller 64 ascertains a storage site on stocker shelf 96 and then initiates the task. When a storage site cannot be ascertained, stocker controller 64 waits for the vacancy of a storage site without initiating the task. Stocker 234 commencing an entry task drives forward translate device 250 to rotate cassette 232 90°, which is then moved from inlet port 254 to inlet delivery port 104. When this transfer task is completed, stocker crane 80 is actuated to carry cassette 232 on inlet delivery port 104 to the storage site on stocker shelf 96 ascertained by stocker controller 64. Thus, the series of an entry task is completed. Upon completion of this task, stocker controller 64 provides a task complete report to host computer 50 via communication cable 58. When inlet port 254 becomes available during the transfer task from inlet port 254 to inlet delivery port 104, stocker 234 provides this port empty information to host computer 50 analogous to the time of initialization, to prepare for the next transportation task using automatic carrier 38.

Host computer 50 receiving an entry task complete report from stocker 234 determines the destination stocker 234 for that cassette 232. Also, confirmation is carried out whether port 98 for inter-stocker transport device 42 of the destination stocker 234 is empty or not. This port empty information is sent to host computer 50 when initialization is completed at the turn-on of stocker 234 or when the relevant port becomes available. When port 98 of destination stocker 234 is empty, host computer 50 sends a transportation task instruction of cassette 232 associated with source stocker 234 to inter-stocker transport device 42 via communication cable 58. In response, inter-stocker transport device controller 66 provides a transfer task request of cassette 232 from the storage site towards port 98 in source stocker 234 via communication cable 58. Stocker 234 that is assigned to the transfer task moves cassette 232 using stocker crane 80. Then, a task complete report is sent to inter-stocker transport device controller 66. In response, inter-stocker transport device controller 66 despatches an empty carriage 162 to a station corresponding to source stocker 234. After this movement, inter-stocker transport device controller 66 provides a request to source stocker 234 so that the relevant cassette 232 on port 98 is moved towards empty carriage 162. Stocker 234 assigned to that request moves cassette 232 through transfer device 82. Then, a task complete report is sent to inter-stocker transport device controller 66. Inter-stocker transport device controller 66 receiving this task complete report moves carriage 162 to the station corresponding to destination stocker 234. Thus, a cassette 232 processed by processing apparatus 32/34 is carried and entered into stocker 234 by automatic carrier 38, and then output by inter-stocker transport device 42 to be sent to the next stocker 234 while the transportation task between stockers is continued.

Control method (2)

By sending the empty information of port 98 of destination stocker 234 from stocker controller 64 to host computer 50 via communication cable 58, a new cassette 232 to be processed is placed on carriage 162 to be transferred to destination stocker 234. At the arrival of carriage 162, inter-stocker transport device controller 66 sends via communication cable 58 a request to stocker controller 64 so that cassette 232 on carriage 162 is placed on port 98. Stocker 234 assigned to this request carries out the task using transfer device 82. Then, a task complete report is sent to inter-stocker transport device controller 66.

In response, inter-stocker transport device 66 sends a report that the task is completed. Host computer 50 receiving this report sends an instruction to destination stocker 234 to enter cassette 232 on port 98. According to the entry task instruction sent via communication cable 58, stocker controller 64 ascertains a storage site on stocker shelf 96 and then initiates the task. When a storage site cannot be ascertained, stocker controller 64 will not initiate the task, and waits for a storage site to become available. Stocker 234 commencing the entry task moves cassette 232 on port 98 to the ascertained storage site on stocker shelf 96 using stocker crane 80. When the instructed task is completed, stocker 234 sends a task complete report to host computer 50. Cassette 232 to be processed that is stored in stocker 234 is left there to wait for cassette stage 172/182 of processing apparatus 32/34 of the subsequent process to become available.

A cassette load request from processing apparatus 32/34 is sent to host computer 50 via communication cable 58 in a state where cassette 232 to be processed is stored in stocker 234. Host computer 50 identifies whether there is a cassette 232 to be processed in stocker 234, and proceeds to an exit task when there is an appropriate cassette. When there is no cassette 232, host computer 50 waits for an appropriate cassette 232 to be entered into stocker 234. Processing apparatus 32/34 may send a load request of a plurality of cassettes 232 at one time according to the type thereof. Since only one cassette 232 can be placed at outlet port 252, the exit task from stocker 234 and the transportation task from stocker 234 to processing apparatus 32/34 corresponding to a request of a plurality of cassettes are repeatedly carried out for the number of the cassettes.

Host computer 50 in the exit task phase selects one of the plurality of output ports 252 according to processing apparatuses 32/34 sending the entry request. Also, an exit task instruction of cassette 232 thereto is sent to source stocker 234 via communication cable 58. The available outlet port 252 is determined according to each of processing apparatuses 32 and 34, similar to inlet port 254. The data thereof is applied to host computer 50 in advance via terminal 54. Stocker 234 receiving the exit task instruction transfers the relevant cassette 232 to outlet delivery port 100 using stocker crane 80. Then, stocker 234 drives forward translate device 250 to forward cassette 232 on outlet delivery port 100 to outlet port 252. Furthermore, cassette 232 is rotated 90° to facilitate the operation of automatic carrier 38. Thus, the exit task to outlet port 252 is completed. Stocker 234 sends a task complete report to host computer 50.

Host computer 50 receiving the exit task complete report from stocker 234 sends an instruction to automatic carrier 38 via communication cable 58 so that cassette 232 on outlet port 252 is carried to cassette stage 172/182 of destination processing apparatus 32/34. Automatic carrier controller 60 receiving this instruction assigns the most appropriate one of the plurality of automatic carriers 38 to the transportation task, whereby that automatic carrier 38 carries out a transportation task of cassette 232 by communication with the main body via radio using control station communication unit 62 and carrier communication unit 142.

This transportation task will be described hereinafter. Carriage 140 of automatic carrier 38 at the standby site moves towards outlet port 252 of stocker 234 according to guide tape 156 affixed to the floor. When arriving at source stocker 234, automatic carrier 38 confirms whether there is a cassette 232 at outlet port 252 via carrier-directed communication unit 102. Then, automatic carrier 38 drives arm 144, hand 142 and hand claw 148 to fetch and place on transfer mount 150 cassette 232 from outlet port 252. When cassette 232 is missing as a result of confirmation, an error is immediately issued. Following the mounting task, carriage 140 moves from stocker 234 to the front of a designated cassette stage 172/182 of destination processing apparatus 32/34. Automatic carrier 38 places cassette 232 on cassette stage 172/182 from mount 150 according to a procedure opposite to that of the above sequence. Before placing cassette 232 on the designated cassette stage 172/182, automatic carrier confirms whether there is no improper cassette 232 on cassette stage 172/182 via carrier-directed communication unit 174. An error is immediately issued when there is an improper cassette 232. This error is based on the determination that another cassette 232 on the relevant cassette stage implies an improper state since cassette 232 is carried according to the empty information of cassette stage 172/182 from processing apparatus 32/34. When all the designated tasks are completed, automatic carrier controller 60 provides a task complete report to host computer 50 via communication cable 58.

Following the loading task of cassette 232 into processing apparatus 32/34 by automatic carrier 38, host computer 50 sends a predetermined process initiation instruction to processing apparatus 32/34 via communication cable 58.

Control Method (3)

When cassette 232 is to be entered into stocker 234 in a manual manner, the operator first places cassette 232 at inlet port 260 and operates operation panel 121 which is provided integral with stocker 234. The operation by panel 121 allows stocker 234 to detect that cassette 232 has been placed at inlet port 260. The information on ID card 240 of that cassette 232 is read by ID card reader/writer 270. The data read out is sent to host computer 50 through communication cable 58. Host computer 50 becomes aware that the operator has placed a cassette 232 by this report. Host computer 50 sends an input task instruction of cassette 232 to stocker 234 without checking the stock status of cassette 232 in stocker 234. The available inlet port 260 is determined corresponding to processing apparatuses 32/34. The data thereof is applied in advance to host computer 50 via terminal 54. According to the entry task instruction provided via communication cable 58, stocker controller 64 ascertains a storage site on stocker shelf 96, and then initiates the task. When a storage site cannot be ascertained, stocker controller 64 will not initiate the task and waits for a storage site to become available. Stocker 234 initiating the entry task instruction transfers cassette 232 on inlet port 260 onto the storage site on stocker shelf 96 using stocker crane 80. When this task is completed, stocker 234 sends a task complete report to host computer 50. Thus, the entry task by an operator is completed.

The method of unloading cassette 232 stored in stocker 234 through outlet port 262 for an operator will be described hereinafter. Consider the case where a cassette is to be loaded to processing apparatus 32/34 from source stocker 234 when automatic carrier 38 is not provided. Processing apparatus 32/34 sends a cassette load request to host computer 50 via communication cable 58. Host computer 50 identifies whether there is a cassette 232 to be processed in stocker 234. When there is a cassette to be processed, host computer 50 proceeds to the exit task phase. When there is no cassette, computer 50 waits for entry of a relevant cassette to be processed into stocker 234. Processing apparatus 32/34 may send a load request of a plurality of cassettes 232 at one time according to the type thereof. When a request of a plurality of cassettes is provided, the exit task from stocker 234 which will be described afterwards will be carried out repeatedly for a number of times corresponding to the number of the requested cassettes.

Host computer 50 in the exit task phase selects any of the plurality of outlet ports 262 according to processing apparatuses 32/34 providing the load request. An exit task instruction associated with the selected outlet port 262 is sent to source stocker 234 via communication cable 58. The available outlet port 262 for manual output is determined depending on each of processing apparatuses 32 and 34, similar to outlet port 252 for the automatic carrier. The data is applied to host computer 50 in advance via terminal 54. The relevant stocker 234 transfers cassette 232 to outlet port 262 using stocker crane 80. Also, a display is provided on operation panel 121 of stocker 234 permitting the operator to take away cassette 232 on outlet port 262. In response to this display, the operator outputs cassette 232 from outlet port 262 and notifies that the take out task is completed to stocker 234 via operation panel 121. In response, stocker 234 determines that the exit task is completed. A complete report thereof is sent to host computer 50 via communication cable 58. The operator unloading cassette 232 must carry that cassette to cassette stage 172/182 of the appropriate processing apparatus 32/34 that issued the load request. However, the operator does not know which processing apparatus 32/34 has issued the request. The operator must use operator's terminal 56 of host computer 50 to identify the appropriate processing apparatus 32/34. Then, the operator carries cassette 232 to the identified appropriate processing apparatus 32/34 and places it on cassette stage 172/182.

The above-described conventional semiconductor wafer cassette transportation apparatus 230 has problems set forth in the following.

Following an exit task to automatic carrier related outlet port 252, host computer 50 sends to automatic carrier 38 a transportation task instruction of cassette 232 from outlet port 252 to processing apparatus 32/34. Therefore, cassette 232 on outlet port 252 has to wait for automatic carrier 38 to come from the standby location to outlet port 252.

SUMMARY OF THE INVENTION

In view of the foregoing, an object of the present invention is to improve the transportation ability of an automatic carrier.

According to an aspect of the present invention, an automatic carrier control method is employed in a semiconductor wafer cassette transportation apparatus including a stocker for storing a plurality of semiconductor wafer cassettes, a processing apparatus for applying a process on a semiconductor wafer cassette, an automatic carrier for carrying out a transportation task of a semiconductor wafer cassette between a stocker and a processing apparatus, an inter-stocker transport device for carrying out a transportation task of a semiconductor wafer cassette between a source stocker and a destination stocker, and a host computer for providing control of the stocker, the inter-stocker transport device, the automatic carrier, and the processing apparatus. The stocker includes an automatic carrier related inlet port for entry of a semiconductor wafer cassette by an automatic carrier. The automatic carrier control method includes the steps of transporting a semiconductor wafer cassette from a processing apparatus to an automatic carrier related inlet port using an automatic carrier under control of the host computer, determining whether there is a preceding semiconductor wafer cassette on the automatic carrier related inlet port, waiting for a predetermined time for the preceding semiconductor wafer cassette on the automatic carrier related inlet port, if any, to be entered, and issuing an error when the preceding semiconductor wafer cassette is still present on the automatic carrier related inlet port at an elapse of the predetermined time.

In the entry of a semiconductor wafer cassette into a stocker, waiting is conducted for a predetermined time if there is a preceding semiconductor wafer cassette. If the preceding semiconductor wafer cassette is not yet removed from the automatic carrier inlet port at the elapse of the predetermined time, an error is issued. Thus, the waiting time for the automatic carrier is minimized even in the case where there is a preceding semiconductor wafer cassette. Therefore, the workability of the automatic carrier can be improved.

According to another aspect of the present invention, an automatic carrier control method is employed in a semiconductor wafer cassette transportation apparatus including a stocker for storing a plurality of semiconductor wafer cassettes, a processing apparatus for applying a process on a semiconductor wafer cassette, an automatic carrier for carrying out a transportation task of a semiconductor wafer cassette between a stocker and a processing apparatus, an inter-stocker transport device for carrying out a transportation task of a semiconductor wafer cassette between a source stocker and a destination stocker, and a host computer for providing control of the stocker, the inter-stocker transport device, the automatic carrier, and the processing apparatus. The stocker includes an automatic carrier related outlet port for exit of a semiconductor wafer cassette by an automatic carrier. The host computer retains data of the number of transportation tasks currently carried out by the automatic carrier and an upper limit value thereof. The automatic carrier control method includes the steps of updating the data of the number of transportation tasks currently carried out, and sending to the automatic carrier a transportation task instruction within a range where the number of transportation tasks currently carried out does not exceed the stored upper limit value.

According to the automatic carrier control method of the present invention, a transportation task instruction is sent within a range not exceeding the stored upper limit value. Therefore, the transportation task instruction will not be delayed. Thus, the workability of the automatic carrier can be improved.

Preferably, the automatic carrier control method further includes the steps of estimating exit of a semiconductor wafer cassette from the automatic carrier related outlet port, and sending a transportation task instruction to the automatic carrier according to the estimation.

In the transportation task of a semiconductor wafer cassette from a stocker to a processing apparatus, exit of a semiconductor wafer cassette from the automatic carrier related outlet port is estimated in advance, and then a transportation task instruction is sent to the automatic carrier. Therefore, workability of the automatic carrier can be improved.

According to a further aspect of the present invention, an automatic carrier control method is employed in a semiconductor wafer cassette transportation apparatus including a stocker for storing a plurality of semiconductor wafer cassettes, a processing apparatus for applying a process on a semiconductor wafer cassette, an automatic carrier for carrying out a transportation task of a semiconductor wafer cassette between a stocker and a processing apparatus, an inter-stocker transport device for carrying out a transportation task of a semiconductor wafer cassette between a source stocker and a destination stocker, and a host computer for providing control of the stocker, the inter-stocker transport device, the automatic carrier, and the processing apparatus. The stocker includes an automatic carrier related outlet port for exit of a semiconductor wafer cassette by the automatic carrier. The automatic carrier control method includes the steps of receiving a process complete report from the processing apparatus, carrying out an unload task to the automatic carrier related outlet port in response to receiving the process complete report, and sending to the automatic carrier a transportation task instruction of a semiconductor wafer cassette processed by the processing apparatus and a semiconductor wafer cassette unloaded at the automatic carrier related outlet port in response to receiving a complete report of unloading at the automatic carrier related outlet port.

In the automatic carrier control method of the present invention, a transportation task instruction is sent to an automatic carrier with the semiconductor wafer cassette at the outlet port and the semiconductor wafer cassette from the processing apparatus to the stocker as one pair after receiving an unload complete report of the semiconductor wafer cassette at the automatic carrier outlet port. Therefore, the automatic carrier will not have to wait for a semiconductor wafer cassette to be unloaded. The workability of the automatic carrier can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 7A and 7B are diagrams for describing a cassette storage site in a stocker viewed from the automatic carrier side and the operator side, respectively.

DESCRIPTION OF THE PREFERRED EMBODIMENTS

Figure 1:
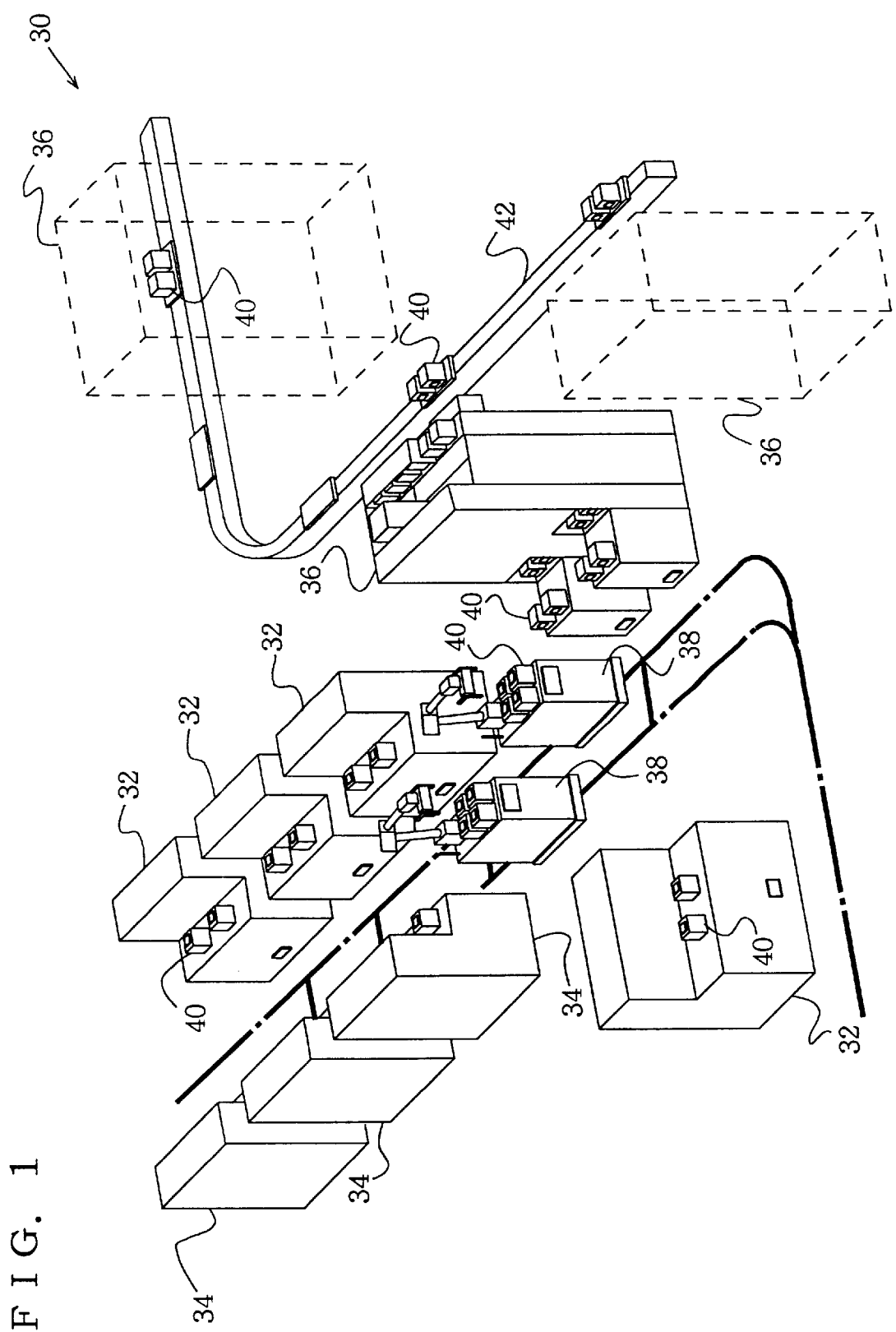
FIGS. 1 and 2 are the bird's eye views of a semiconductor wafer cassette transportation apparatus 30.
Figure 2:
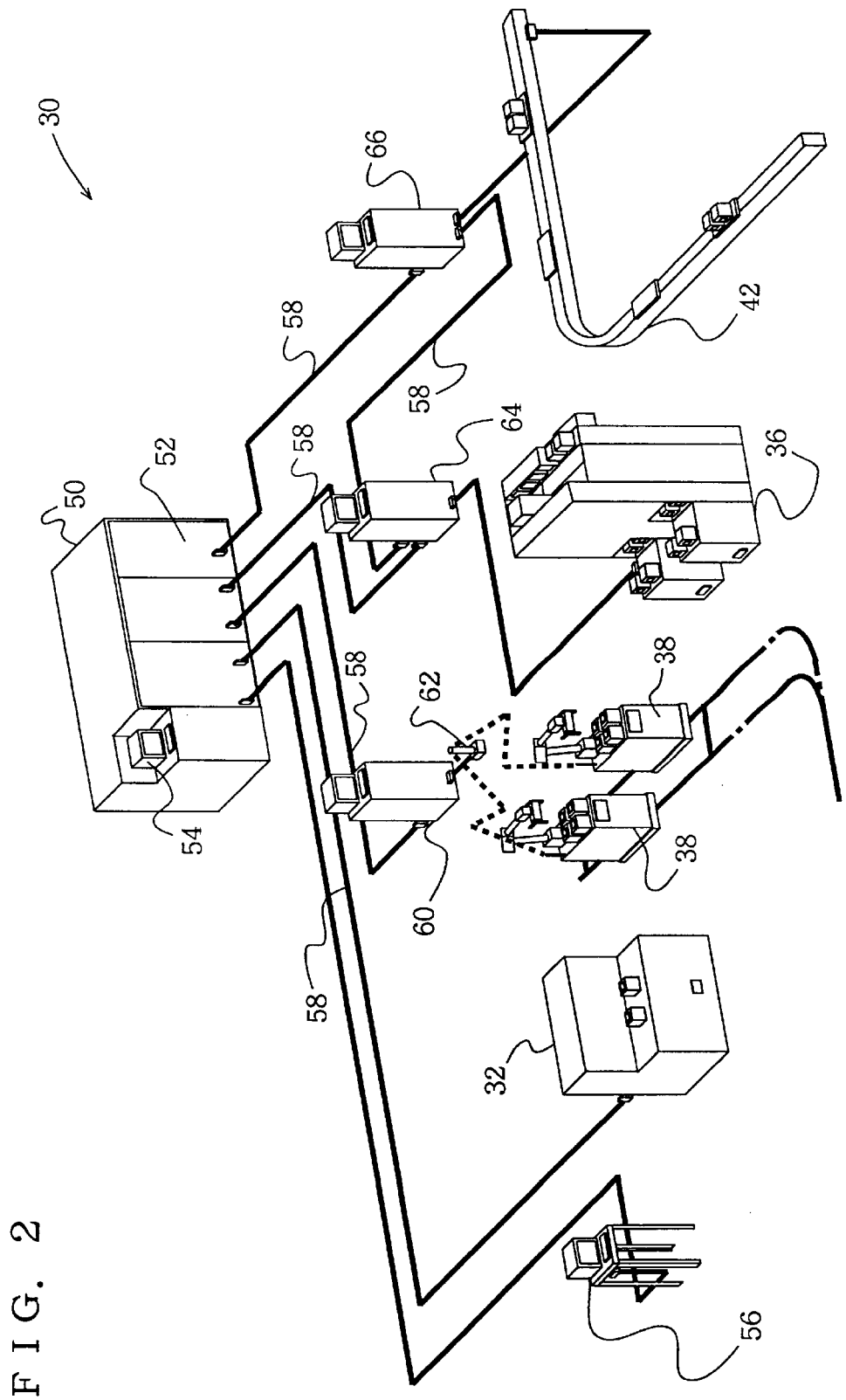

Referring to FIGS. 1–2, a semiconductor wafer cassette transportation apparatus 30 according to an embodiment of the present invention includes conventional processing apparatuses 32 and 34, a novel stocker 36, a conventional automatic carrier 38 and a conventional inter-stocker transport device 42. Processing apparatuses 32 and 34 are applied with a certain stocker 36 as the storage site of a cassette 40 before and after being subjected to a process. Two automatic carriers 38 are engaged in the transportation task therebetween. For the sake of convenience, inter-stocker transport device 42 is shown in the drawing in a cut off manner. In practice, inter-stocker transport device 42 is arranged in a circulating manner with a plurality of stockers 36 disposed in the proximity thereof. The group of processing apparatus 32/34 and automatic carrier 38 correspond to each of other stockers 36.

Semiconductor wafer cassette transportation apparatus 30 further includes a conventional host computer 50, a main body 52 thereof, a terminal 54, an operator's terminal 56, a communication cable 58 respectively connected to host computer 50, processing apparatuses 32 and 34, stocker 36, and automatic carrier 38 for providing connection between stocker 36 and inter-stocker transport device 42, a stocker controller 64, an automatic carrier controller 60, and a inter-stocker transport device controller 66. Although communication between automatic carrier controller 60 and automatic carrier 38 is carried out by radio via a control station side communication unit 62, communication therebetween can be carried out by wire.

Figure 3A:
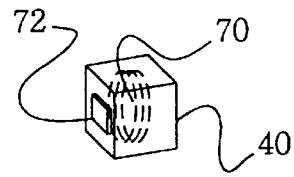
FIGS. 3A, 3B and 3C are diagrams for describing a semiconductor wafer cassette 40 and an ID card 72.
Figure 3B:
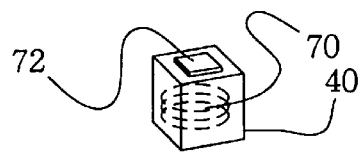
Figure 3C:
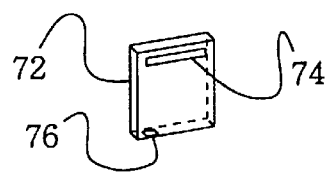

Referring to FIG. 3, a semiconductor wafer 70 and a cassette 40 are similar to those of conventional ones. An ID card 72 includes a display unit 74 and a communication unit 76 similar to conventional ones. It is to be noted that communication unit 76 is attached at the bottom, not the front side, of ID card 72 in the present invention.

The structural elements of semiconductor wafer cassette transportation apparatus 30 according to the present embodiment will be described in detail with reference to the drawings.

Figure 4:
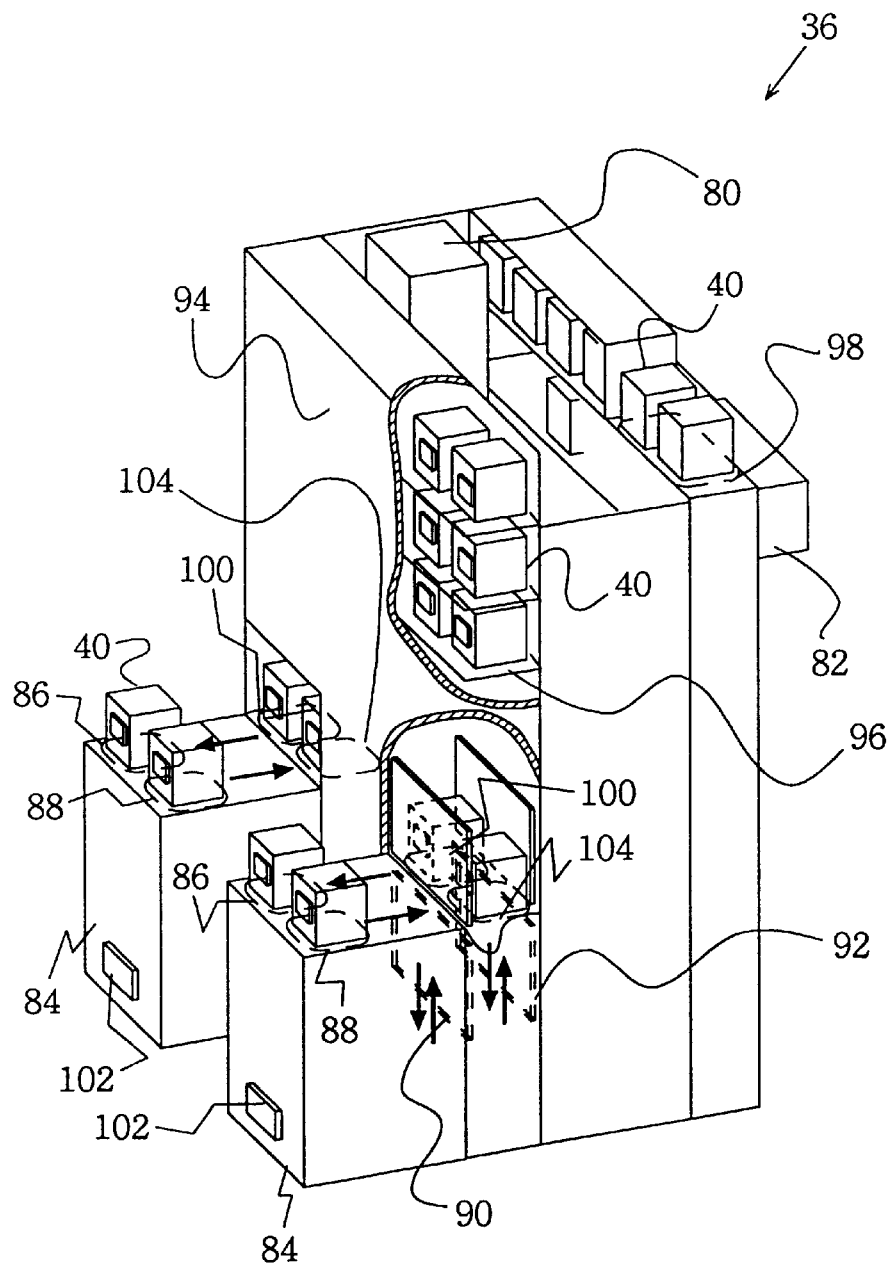
FIG. 4 shows a stocker 36 viewed from the automatic carrier side.
Figure 5:
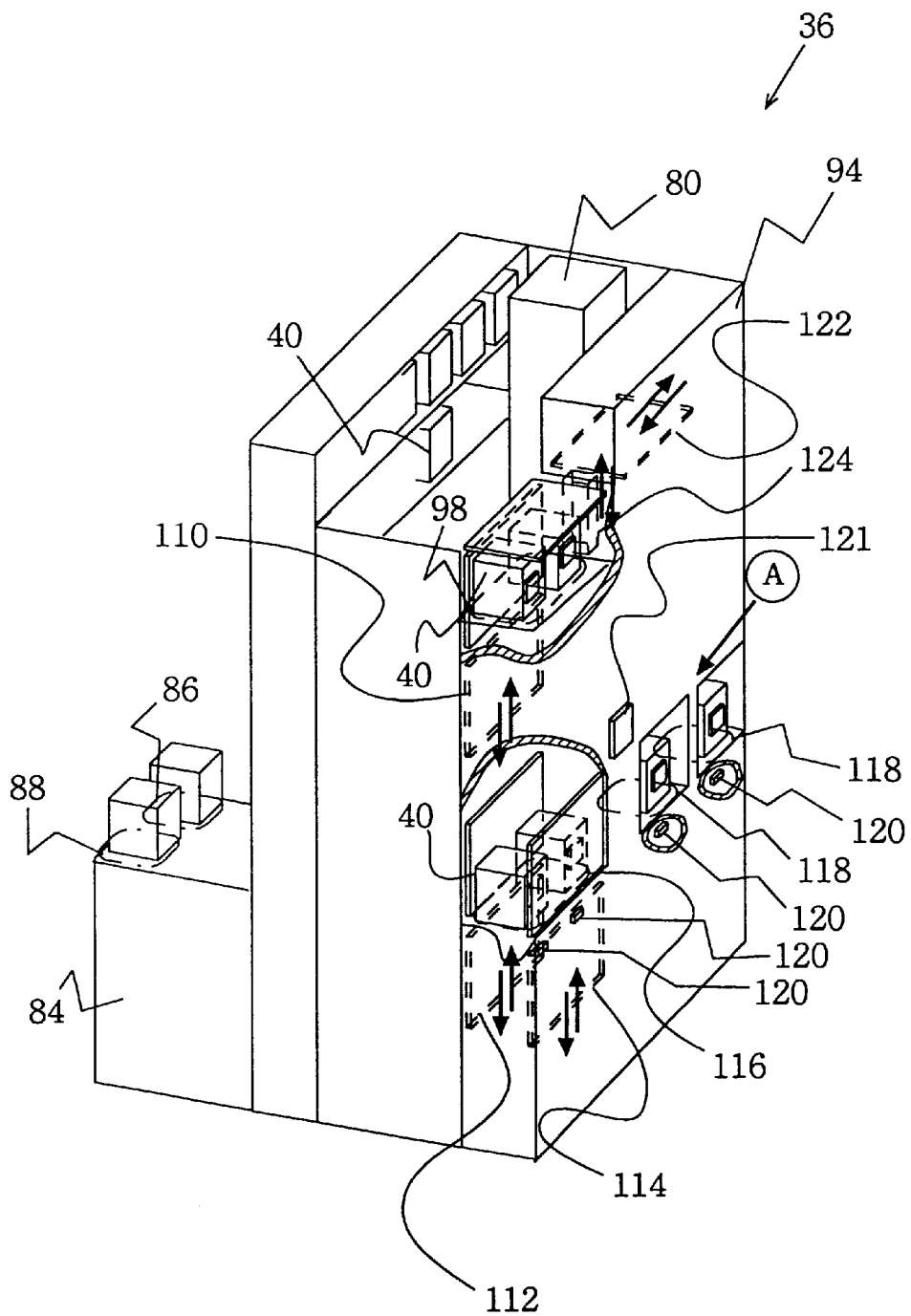
FIG. 5 shows a stocker 36 viewed from the operator side.

A stocker 36 will be described with reference to FIGS. 4–6. In FIGS. 4 and 5, a stocker panel 94 is shown with a portion thereof cut away so that the interior of stocker 36 is shown.

Stocker 36 includes a stocker shelf 96, a port 98 for the inter-stocker transport device, an inlet port 116 for manual input, an outlet port 118 for manual output, an outlet port 86 for an automatic carrier, an outlet delivery port 100 for an automatic carrier, an inlet port 88 for an automatic carrier, an inlet delivery port 104 for an automatic carrier, a stocker crane 80, a transfer device 82, a forward translate device 84, and an automatic carrier-directed communication unit 102.

Stocker crane 80, transfer device 82, and forward translate device 84 carry out a transportation task in the unit of one cassette, two cassettes, and one cassette, respectively. The number of cassettes that can be mounted at inter-stocker transport device related port 98, inlet port 116 for manual input, output port 118 for manual output, automatic carrier related outlet delivery port 100, automatic carrier related inlet delivery port 104, automatic carrier related outlet port 86, and automatic carrier related inlet port 88 is two cassettes, two cassettes, one cassette, one cassette, one cassette, one cassette, and one cassette, respectively.

Two forward translate devices 84 are prepared likewise the conventional case. Accordingly, two automatic carrier related outlet ports 86, two automatic carrier related inlet ports 88, two automatic carrier related outlet delivery ports 100, and two automatic carrier related inlet delivery ports 104 are provided. There are two outlet ports 118 for manual output whereas there is only one inlet port 116 for manual input.

Figure 6:
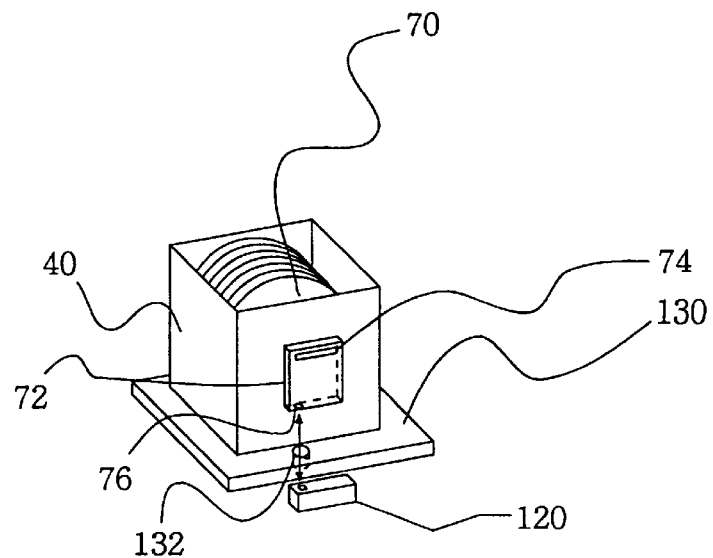
FIG. 6 is a diagram for describing an outlet port for manual output of stocker 36.

As shown in FIG. 6, an ID card reader/writer 120 is attached at outlet port 118 for manual output. ID card reader/writer 120 is also attached at inlet port 116 for manual input as in the conventional case. In stocker 36, four ID card reader/writers 120 are provided. The direction of attachment thereof differs from the conventional one. Since ID card communication unit 76 is attached at the bottom of ID card 72, ID card reader/writer 120 can be provided beneath a cassette receiver 130. It is therefore possible to have the front of ID card 72 face the working plane side of the operator. Stocker crane 80 cannot alter the direction of cassette 40 as in the conventional case. Therefore, the orientation of cassette 40 on stocker shelf 96 is identical to that on inlet port 116 for manual input. The orientation of cassette 40 placed at automatic carrier related outlet port 86 and automatic carrier related inlet port 88 is set so that automatic carrier 38 can easily carry out a transfer operation. The attached ID card 72 faces the operation plane side of the automatic carrier. This is identical to the orientation of cassette 40 on automatic carrier related outlet delivery port 100 and on automatic carrier inlet delivery port 104 which are a portion of stocker shelf 96. Stocker 36 does not have to alter the orientation of cassette 40 90° during the transfer task of cassette 40 by forward translate device 84 as in the conventional case.

Referring to FIGS. 4 and 5, stocker 36 further includes an automatic carrier related port outer shield door 90 for maintaining airtightness, movable in the vertical direction, and located at the outer side of outlet delivery port 100 and inlet delivery port 104, and an automatic carrier related port inner shield door 92 for maintaining airtightness, movable in the vertical direction, and located at a side of outlet delivery port 100 and inlet delivery port 104, inner in stocker 36.

Although the drawing only shows inner and outer shield doors 92 and 90 provided at both sides of outlet delivery port 100 and inlet delivery port 104, inner and outer shield doors 92 and 90 are also provided at both sides of the other outlet delivery port 100 and inlet delivery port 104.

Stocker 36 further includes an outer shield door 114 and an inner shield door 112 corresponding to the port for manual input/output. Outer shield door 114 and inner shield door 112 can be moved in the vertical direction for the purpose of maintaining airtightness of stocker 36. Port outer shield door 114 is located outer of inlet port 116 or outlet port 118. Inner shield door 112 is located inner of inlet port 116 or outlet port 118.

Although only the shield doors are shown for inlet port 116, similar shield doors are provided also for the two outlet ports 118.

Stocker 36 further includes an outer shield door 122 located at the outer side of inter-stocker carrier device related port 98, and an inner shield door 110. Outer and inner shield doors 122 and 110 both function to maintain the airtightness of stocker 36. Inner shield door 110 is located at a side of port 98 inner in stocker 36.

Port 98 can have outer shield door 122 opened, and ascend or descend by means of an elevator 124. Outer shield door 122 is shifted horizontally, and inner shield door 110 is moved vertically. Transfer device 82 performs a task with respect to port 98 that is located at an ascended position by elevator 124, whereas stocker crane 80 performs a task with respect to port 98 that is located at a descended position by elevator 124.

FIGS. 7A and 7B show the storage site in stocker 36 viewed from the operation plane side of automatic carrier 38 and the operation plane side of the operator, respectively. The label of STK01 to STK04 indicate the stocker unit number, which are divisions of the storage site in stocker 36 to facilitate administration of the storage site. Labels T01 to T07 indicate the shelf number of stocker shelf 96, indicating the position of the lateral row. The labels of P01 to P04 indicate the position number, corresponding to the vertical row for each stocker unit.

Figure 8:
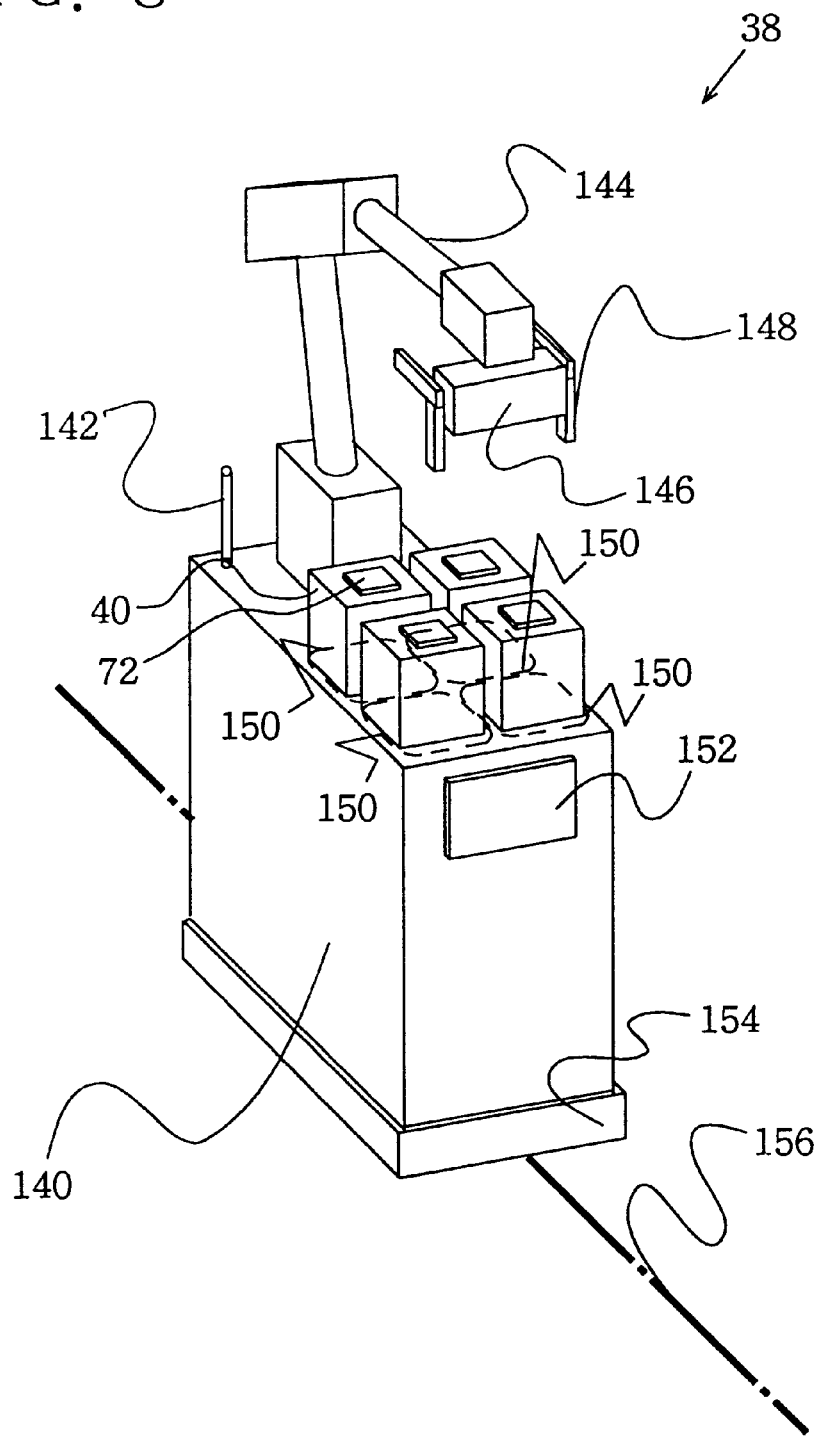
FIG. 8 shows an appearance of an automatic carrier 38.

Referring to FIG. 8, automatic carrier 38 includes a carriage 140 that runs along a guide tape 156 that is affixed to the floor, a carrier communication unit 142 for transferring information to and from control station communication unit 62 of automatic carrier controller 60, an arm 144, a hand 146 and a hand claw 148 to perform a transfer task of cassette 40, four transfer mounts 150 for maintaining, during the travel, cassette 40 in the vertical orientation unloaded from processing apparatus 32/34 or stocker 36, an operation panel 152 for transferring information to and from an operator, and a bumper 154 to detect an obstacle for ceasing the currently carried out task.

Although automatic carrier 38 is a non-track robot that is guided by guide tape 156, a track-type robot may be used instead. Also, a robot of a type that carries cassette 40 in a continuously clutched manner by means of hand claw 148 can be used, so that transfer mount 150 is dispensable. Furthermore, a hand 146 that can transfer a plurality of cassettes 40 together at one time can be provided.

Figure 9:
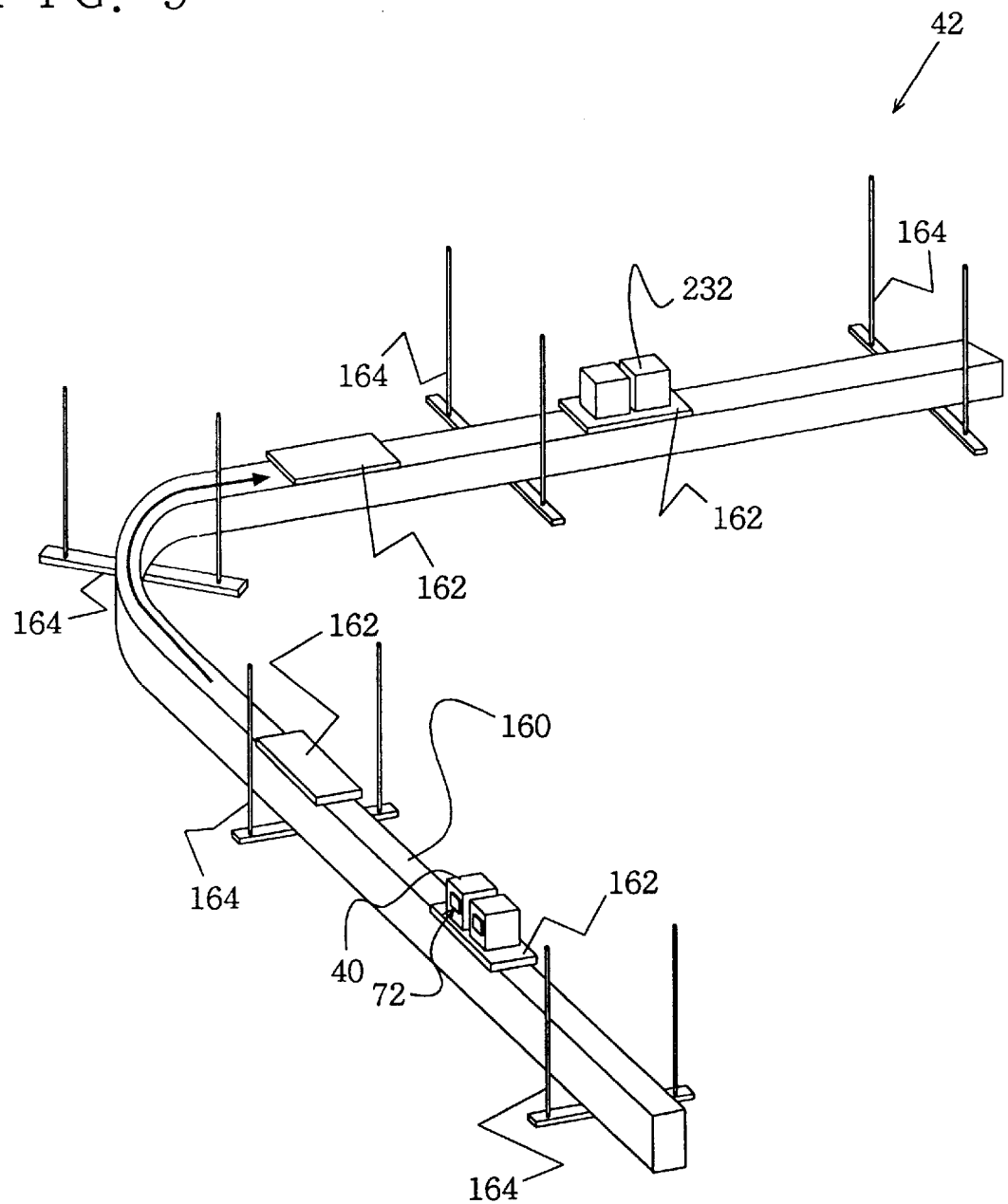
FIG. 9 shows an appearance of an inter-stocker transport device 42.

Referring to FIG. 9, inter-stocker transport device 42 includes a rail 160 forming a loop, a carriage 162 moved in one direction (in the direction of the arrow) on rail 160 for carrying 2 cassettes at most, and a pendant 164 for hanging rail 160 from the ceiling.

Figure 10:
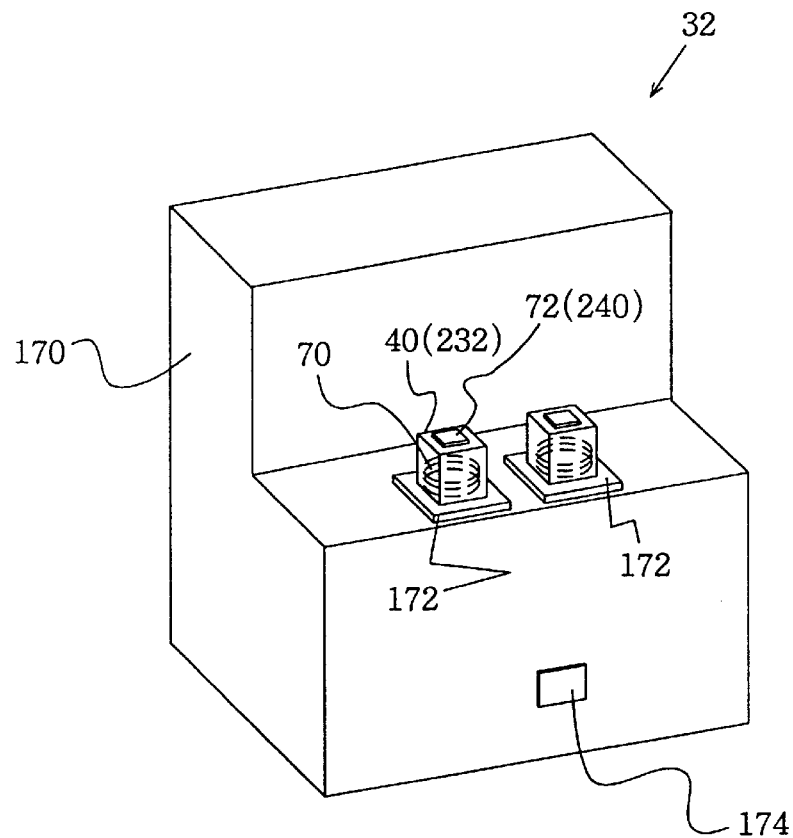
FIG. 10 shows an appearance of a processing apparatus 32.

Referring to FIG. 10, processing apparatus 32 includes a main body 170 for applying a semiconductor integrated circuit fabrication process on wafer 70 in the unit of one or a plurality of wafers, two cassette stages 172 for receiving cassette 40 to be processed one by one, and an automatic carrier-directed communication unit 174 for providing information of the state of cassette stage 172 to automatic carrier 38 to confirm whether an improper cassette 40 is placed on cassette stage 172 before automatic carrier 38 places a cassette 40 to be processed on cassette stage 172, or whether cassette 40 that has been processed is properly placed on cassette stage 172 before unloading.

Figure 11:
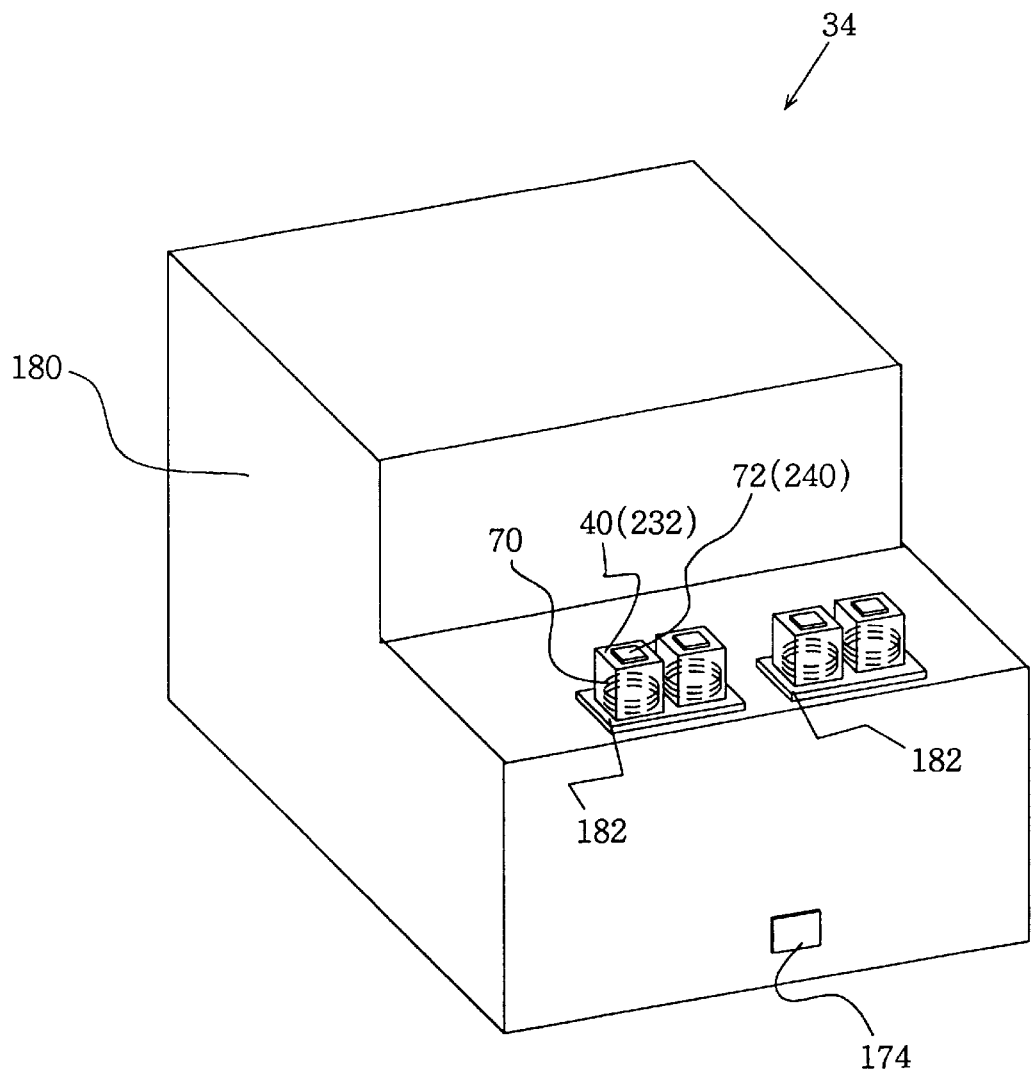
FIG. 11 shows an appearance of a processing apparatus 34.

Referring to FIG. 11, a processing apparatus 34 includes a main body 180 for applying a semiconductor integrated circuit fabrication process on wafer 70 for every one or a plurality of wafers, two cassette stages 182 for receiving cassette 40 to be processed in the unit of 2 cassettes, and an automatic carrier-directed communication unit 174 for providing to automatic carrier 38 information of the state of cassette stage 182 to confirm whether an improper cassette 40 is placed on cassette stage 182 before automatic carrier 38 places cassette 40 to be processed on cassette stage 182 or whether a processed cassette 40 is properly mounted on cassette stage 182 before it is unloaded.

The entry control method of cassette 40 into stocker 36 in semiconductor wafer cassette transportation apparatus 30 will be described hereinafter, mainly divided into (1) the task of storing a processed cassette 40 from processing apparatuses 32/34 into stocker 36, (2) the task of carrying cassette 40 from a source stocker 36 to a destination stocker 36, and (3) the task of entering cassette 40 into stocker 36 through inlet port 116 for manual input.

Entry Control Method of Task (1)

Host computer 50 has the information stored in advance of the stocker capacity, i.e., the maximum number of cassettes 40 that can be stored on stocker shelves 96 in each stocker 36. This information of the stocker capacity is entered through terminal 54. When a cassette 40 is to be stored into stocker 36, host computer 50 determines whether there is an available space in stocker 36 by subtracting the number of cassettes to be stored from the predetermined value of the stocker capacity. Since host computer 50 provides control of the available space in stocker 36, stocker 36 does not have to send the report of an empty automatic carrier related inlet port 88 and inter-stocker transport device related port 98 to host computer 50.

In a conventional manner, processing apparatus 32/34 provides a request to host computer 50 via communication cable 58 to have the processed cassette 40 handed over. As shown in FIGS. 10 and 11, processing apparatus 32/34 provides a hand-over request for one cassette or a plurality of cassettes according to the type thereof. Host computer 50 receiving the hand-over request subtracts the number of requested cassettes from the value of the storage capacity, and proceeds to the transportation task phase using automatic carrier 38. When the subtracted result shows a negative number, host computer 50 determines that cassette 40 cannot be stored. Therefore, host computer 50 will not proceed to the transportation task phase using automatic carrier 38. As in the conventional case, one inlet port 88 is assigned corresponding to each of a plurality of processing apparatuses 32 and 34. The assigned information thereof is prestored in host computer 50. Even when the hand-over request from processing apparatus 32/34 is provided corresponding to every two cassettes, host computer 50 must send an transportation task instruction for one cassette at a time to automatic carrier 38 since there is only the capacity of one cassette at inlet port 88.

Automatic carrier controller 60 receiving a transportation task instruction of 1 cassette from host computer 50 sends an instruction so that cassette 40 on cassette stage 172/182 is carried from processing apparatus 32/34 to inlet port 88 of destination stocker 36 likewise a conventional case. When the task is completed, automatic carrier controller 60 sends a task complete report to host computer 50 via communication cable 58.

Upon receiving a task complete report, host computer 50 sends an entry task instruction to stocker controller 64 so that cassette 40 is entered into stocker 36 through inlet port 88. According to this entry task instruction sent through communication cable 58, stocker controller 64 commences the entry task after ascertaining a storage site on stocker shelf 96. Only in an error state will the storage site not be ascertained. This is because host computer 50 has confirmed an available space in stocker 36 before initiating the transportation task carried out by automatic carrier 38. Stocker 36 commencing the entry task with no problem transfers cassette 40 on inlet port 88 to the appropriate storage site on stocker shelf 96. Here, forward translate device 84 does not have to rotate cassette 40 by 90° during the transfer task since the orientation of cassette 40 at inlet port 88 is identical to the orientation of cassette 40 at inlet delivery port 104. When the task is completed, stocker controller 64 sends a task complete report to host computer 50 via communication cable 58. Thus, a processed cassette 40 of processing apparatus 32/34 is accommodated in stocker 36.

Entry Control Method of Task (2)

When cassette 40 processed by processing apparatus 32/34 is accommodated in stocker 36, host computer 50 sets that stocker 36 as the source stocker 36 and determines a destination stocker 36 corresponding to a subsequent processing apparatus 32/34 identified from the stored information in cassette 40 in source stocker 36. Then, host computer 50 subtracts the number of cassettes to be stored from the value of the cassette capacity (the current number cassettes that can be stored in the relevant stocker) in destination stocker 36. The control proceeds to the transportation task using inter-stocker transport device 42. Host computer 50 determines that the cassette cannot be stored when the subtracted result shows a negative number. In this case, control does not proceed to the transportation task using automatic carrier 38.

Host computer 50 in a transportation task phase sends a transportation task instruction to inter-stocker transport device 42 via communication 58 likewise the conventional case. The destination set by that instruction is the storage site of stocker shelf 96 in destination stocker 36, not the conventional inter-stocker carrier device related port 98. Inter-stocker carrier controller 66 receiving the transportation task instruction sends a request to source stocker 36 via communication cable 58 so that cassette 40 is transferred from the storage site to port 98. Stocker 36 receiving the request carries out a predetermined task for the relevant cassette task 40 using stocker crane 80. Then, a task complete report is sent to inter-stocker transportation device controller 66. Upon receiving the task complete report, inter-stocker transport device controller 66 despatches an empty carriage 162 to the station corresponding to source stocker 36.

Upon completion of this travel, inter-stocker transport device controller 66 sends a request to source stocker 36 so that the relevant cassette 40 on port 98 is transferred to empty carriage 162. Stocker 36 receiving the request transfers cassette 40 using transfer device 82. Then a task complete report is sent to inter-stocker transport device controller 66. Upon receiving this task complete report, inter-stocker transport device controller 66 has carriage 162 moved to the station corresponding to destination stocker 36.

When this travel is completed, inter-stocker transport device controller 66 sends a request to controller 64 for the destination stocker via communication cable 58 so that cassette 40 on carriage 162 is stored on stocker shelf 96 via port 98. Stocker controller 64 receiving the request ascertains a storage site on stocker shelf 96 for cassette 40. Stocker controller 64 drives transfer device 82 to move cassette onto port 98. Then, cassette 40 on port 98 is transferred to the ascertained storage site on stocker shelf 96 by means of stocker crane 80. Stocker controller 64 will not be able to ascertain a storage site only in the case of an error during the storage task of cassette 40. This is because host computer 50 has confirmed an available space in destination stocker 36 before initiating the transportation task.

Upon completion of the task, stocker controller 64 reports to inter-stocker transport device controller 66 that the task is completed. In response, inter-stocker transport device controller 66 sends a task complete report to host computer 50. Thus, a transportation task of a cassette from a source stocker 36 to a destination stocker 36 is completed.

Entry Control Method of Task (3)

When an operator (not shown) is to enter cassette 40 into stocker 36, the operator first places cassette 40 on inlet port 116. Then, the operator manipulates operation panel 121 provided at stocker 36, whereby stocker 36 identifies that cassette 40 has been placed on inlet port 116. The information stored in ID card 72 of cassette 40 is read by ID card reader/writer 120. The read data is sent to host computer 50 via communication cable 58.

In response, host computer 50 is notified that an operator has loaded cassette 40. Host computer 50 subtracts the number of cassettes to be entered from the value of the cassette capacity in stocker 36. Control proceeds to the transportation task using stocker 36. When the subtracted result indicates a negative number, stocker 36 determines that cassette 40 cannot be stored. Therefore, control does not proceed to the entry task. When host computer 50 enters the entry task phase, an entry task instruction is sent to stocker controller 64 via communication cable 58. According to the transmitted entry task instruction, stocker controller 64 initiates that task after ascertaining a storage site of cassette 40 on stocker shelf 96. Stocker controller 64 will not be able to ascertain a storage site during storage of cassette 40 only in the case of an error. This is because host computer 50 has confirmed an available space in stocker 36 before this transportation task is initiated.

Stocker 36 drives stocker crane 80 to transfer cassette 40 on inlet port 116 to the storage site on stocker shelf 96. When the task is completed, stocker 36 sends a task complete report to host computer 50. Thus, the entry task by an operator is completed.

According to the stocker entry task control method of semiconductor wafer cassette transportation apparatus 30, host computer 50 has the storage capacity of the maximum number of cassettes that can be stored in each stocker 36 entered in advance through terminal 54. In storing a cassette, a storage site is ascertained by the information of subtracting the number of cassettes to be stored from the value of the storage capacity. Accordingly, the storage task from processing apparatus 32/34 to stocker 36 or the transportation task between stockers can be carried out without the requirements of an empty automatic carrier related inlet port 88 or an empty inter-stocker transport device related port 98.

Automatic carrier 38 will no longer be inhibited of commencing the transportation task of a processed cassette 40 from processing apparatus 32/34 until there is no more preceding cassette 40 on inlet port 88. Therefore, the problem of a processed cassette 40 being left for a long time at processing apparatus 32/34 is eliminated. Also, the problem of not exhibiting the predetermined transportation ability regardless of the low rate of operation of automatic carrier 38 is eliminated.

The case where the transportation task of a cassette from processing apparatus 32/34 to stocker 36 is carried out only under the condition of an empty inlet port 88 of stocker 36 and the case where the stock status of the storage site in stocker 36 is not confirmed will no longer be encountered. Therefore, the problem of cassette 40 left for a long time on inlet port 88 even after an entry task instruction is sent from host computer 50 to stocker 36 since there is no available space in the storage site is solved.

The case of inter-stocker transport device 42 being inhibited of a transportation task of a subsequent cassette 40 in source stocker 36 until there is no cassette 40 on port 98 will no longer be encountered. Therefore, the problem that subsequent cassette 40 is left for a long time at the source stocker 36 is solved. Also, the problem that the predetermined transportation ability is not exhibited even though the rate of operation is low is solved.

Furthermore the case of the transportation task of cassette 40 from source stocker 36 to destination stocker 36 being carried out only under the condition of an empty port 98 of destination stocker 36 without confirming the stock status of the storage site in stocker 36 is no longer encountered. Therefore, the problem of cassette 40 being left on port 98 for a long time even after an entry task instruction is sent from host computer 50 to stocker 36 following the transportation task to port 98 since there is no available space for storage is no longer encountered.

Furthermore, the problem of cassette 40 left on inlet port 116 for a long time even after an entry task instruction is sent from host computer 50 to stocker 36 since there is no storage site available is no longer encountered.

The transportation task of cassette 40 from processing apparatus 32/34 to inlet port 88 or from source stocker 36 to destination stocker 36 can be initiated as long as a storage site in stocker 36 for a subsequent cassette 40 is ascertained even if there is a cassette 40 on inlet port 88 or port 98. Cassette 40 will not be left for an extra time at processing apparatus 32/34 or source stocker 36. Also, cassette 40 arriving at inlet port 88, port 98, or inlet port 116 will not be left for an idle time since the storage site on stocker shelf 96 in stocker 36 is ascertained.

The exit control method of cassette 40 from stocker 36 in semiconductor wafer cassette transportation apparatus 30 will be described hereinafter, mainly divided into (4) the task of unloading to automatic carrier 38 through outlet port 86, (5) the task of unloading to inter-stocker transport device 42 from source stocker 36 through port 98, and (6) the task of unloading to an operator through outlet port 118.

Exit Control Method of Task (4)

Likewise a conventional case, when a cassette load request is sent from processing apparatus 32/34 to host computer 50 via communication cable 58, host computer 50 searches for a cassette 40 that is to be processed in stocker 36. Control proceeds to the exit task when there is such a cassette 40. Host computer 50 entering the exit task phase sends to stocker 36 via communication cable 58 an exit task instruction of cassette 40 on stocker shelf 96 to outlet port 86 that is predetermined for each of processing apparatuses 32 and 34. Upon receiving the exit task instruction, stocker 36 drives stocker crane 80 to transfer the relevant cassette 40 to outlet delivery port 100. Then, cassette 40 on outlet delivery port 100 is forwarded to outlet port 86 by forward translate device 84. Front device 84 does not have to rotate the orientation of cassette 40 by 90° during this task.

Upon completion of the exit task to outlet port 86, stocker 36 sends a task complete report to host computer 50. During this series of the task of stocker 36, the information of unloading cassette 40 from the storage site of stocker shelf 96 by stocker crane 80 is sent to host computer 50 via communication cable 58 from stocker controller 64. Host computer 50 receiving this information adds, in contrast to subtracting in the entry task, this number of unloaded cassettes to the value of cassette capacity in stocker 36. Cassette 40 unloaded at outlet port 86 is carried by automatic carrier 38 to processing apparatus 32/34 that issued that load request.

Exit Control Method of Task (5)

Host computer 50 receiving an entry task complete report from stocker 36 determines an appropriate destination stocker 36 corresponding to a subsequent processing apparatus 32/34 identified by the stored information in cassette 40. An inter-stocker transportation task instruction is sent via communication cable 58 to inter-stocker transport device 42. Inter-stocker transport device controller 66 receiving the transportation instruction first sends a request to source stocker 36 via communication cable 58 to perform a transfer task of cassette 40 from the storage site to port 98. Stocker 36 receiving the request transfers the appropriate cassette 40 using stocker crane 80. Then, a task complete report is sent to inter-stocker transport device controller 66.

When stocker crane 80 unloads cassette 40 from the storage site on stocker shelf 96, stocker controller 64 sends this information to host computer 50 through inter-stocker transport device controller 66. Alternatively, the information is directly sent to host computer 50 via communication cable 58. Host computer 50 receiving this information adds the number of unloaded cassettes to the number of the cassette capacity in stocker 36. Cassette 40 unloaded from port 98 is carried to destination stocker 36 according to the task of (2) in which cassette 40 is conveyed from source stocker 36 to destination stocker 36.

Exit Control Method of Task (6)

The case where automatic carrier 38 is not installed will be considered. In response to processing apparatus 32/34 sending a cassette load request to host computer 50 via communication cable 58, host computer 50 searches for a cassette 40 to be processed in stocker 36.

When there is a cassette 40, host computer 50 proceeds to an exit task phase. Host computer 50 sends to stocker 36 via communication cable 58 a transportation task instruction of cassette 40 on stocker shelf 96 to outlet port 118 that is predetermined for each processing apparatus 32/34, as in the case for outlet port 86. In response, stocker 36 transfers cassette 40 to outlet port 118 by means of stocker crane 80. Then, a display permitting output through outlet port 118 is provided on operation panel 121 of stocker 36.

The operator reading the unload permission message takes cassette 40 from outlet port 118, and manipulates operation panel 121 to notify stocker 36 that the unload task is completed. In response, stocker 36 determines that the exit task is completed. A task complete report is sent to host computer 50 via communication cable 58. When stocker crane 80 unloads cassette 40 from the storage site of stocker shelf 96, stocker controller 64 provides this information to host computer 50 via communication cable 58. Host computer 50 receiving this information adds the number of unloaded cassettes to the value of the cassette capacity in stocker 36. The operator unloading cassette 40 approaches terminal 56 of host computer 50 to identify processing apparatus 32/34 that issued the load request. Then the operator carries cassette 40 to cassette stages 172/182 of the appropriate processing apparatus 32/34.

In the above stocker exit task control method, host computer 50 adds the number of unloaded cassettes according to the information reported from stocker controller 64 when cassette 40 is unloaded from stocker shelf 96 by stocker crane 80 to the value of the cassette capacity in stocker 36, in contrast to the subtraction carried out in an entry task of stocker 36. Accordingly, host computer 50 identifies an available space of the storage site. As a result, host computer 50 can initiate a transportation task from processing apparatus 32/34 to stocker 36 or between stockers 36 more quickly than the case where the transportation task is triggered by the information of an empty inlet port 88 and port 98.

Thus, the case of automatic carrier 38 being inhibited of initiating a transportation task of a processed cassette 40 from processing apparatus 32/34 until there is no more preceding cassette 40 on inlet port 88 is no longer encountered. Therefore, the problem that a processed cassette 40 will be left for a long time at processing apparatus 32/34 is solved. Also, the problem that the predetermined transportation ability cannot be exhibited even though the rate of operation of automatic carrier 38 is low is solved.

Also, the case of inter-stocker transport device 42 being inhibited of initiating an transportation task of a subsequent cassette 40 of source 36 until there is no more preceding cassette 40 on port 98 is no longer encountered. Therefore, the problem of a subsequent cassette 40 being left at source stocker 36 is eliminated. Also, the problem is solved of a predetermined transportation ability not exhibited even though the rate of operation of inter-stocker transport device 42 is low.

Thus, the transportation task from processing apparatus 32/34 to inlet port 88 and from source stocker 36 to destination stocker 36 is initiated immediately when there is an available space physically in stocker shelf 96 of stocker 36. There is an advantage that the standby time of cassette 40 at processing apparatus 32/34 and source stocker 36 can be reduced.

Host computer 50 does not retain the information of the storage site of each cassette 40 in stocker 36. The administration thereof is left to stocker controller 64. Therefore, host computer 50 identifies the storage site on the basis of a numeric value. In other words, the storage site is governed according to a value by subtracting the appropriate number of cassettes from the stocker capacity of the maximum number of cassettes that can be stored in stocker 36. Another method of recognizing the storage site will be described hereinafter.

Host computer 50 receives information associated with the labeled storage site in stocker 36, as shown in FIGS. 7A and 7B through terminal 54, and a report of the storage site according to a relevant label in stocker 36 when a storage task from stocker 36 of cassette 40 is completed. By the information, host computer 50 can identify that there is an available space in the storage site of stocker 36 when there is no cassette 40 in that storage site.

Host computer 50 does not designate the storage site of cassette 40 to stocker 36 in the entry task. The storage site is determined by stocker controller 64. An approach can be considered of host computer 50 determining the storage site of stocker 36 itself prior to an entry task and sending the instruction to stocker controller 64. In this case, stocker controller 64 will not determine the storage site and stores an appropriate cassette 40 in the storage site designated by host computer 50. Host computer 50 can identify that there is an available space in the storage site of stocker 36 when there is no cassette 40 in the storage site.

Host computer 50 can specify through terminal 54 a plurality of inlet ports 88 that can be used by one processing apparatus 32/34. Also, the usage sequence of the inlet port 88 can be specified together. For example, in the case shown in FIG. 1, for example, the number of inlet ports 88 corresponding to one processing apparatus 32/34 is set to 2, and the usage sequence thereof is specified. When a hand-over request of cassette 40 is sent from processing apparatus 32 to host computer 50, host computer 50 determines a corresponding one of the plurality of inlet ports 88 that is subsequent to the previously used inlet port 88, or the first inlet port 88 of the specified usage sequence when there is no further inlet port 88 in the sequence to be used for the transportation task of cassette 40.

According to the stocker entry task control method, a plurality of automatic carrier inlet ports 88 can be assigned to one processing apparatus 32/34. By assigning inlet ports 88 at a predetermined order, inlet ports 88 can be used substantially equally.

Further preferably, host computer 50 can specify a plurality of inlet ports 88 that can be used for one processing apparatus 32/34 through terminal 54. Also, host computer 50 may include a data area in which the number of transportation tasks not yet completed out of the transportation task instructions issued to automatic carrier 38 with respect to each port 88 can be stored. When host computer 50 receives a hand-over request of cassette 40 from processing apparatus 32/34, host computer 50 searches for inlet port 88 that is available for processing apparatus 32/34. When there are a plurality of inlet ports 88 that can be used, host computer 50 compares the number of task instructions stored in the data area corresponding to respective port 88 to select inlet port 88 indicating a lower value. Host computer 50 adds 1 to the value in this data area associated with the selected port 88, and sends a transportation task instruction to automatic carrier 38. When a task is completed, the value in the data area is decremented by 1. When there are a plurality of ports 88 indicating the same number of transportation tasks not yet completed, host computer 50 selects an arbitrary port 88 therefrom.

According to the stocker entry task control method, a plurality of inlet ports 88 can be assigned to one processing apparatus 32/34. A transportation task instruction can be sent to another automatic carrier 38 so that the number of tasks not yet completed is equalized. Therefore, the usage frequency of port 88 can be substantially equalized.

Therefore, the problem is solved of variation in the usage and occupancy of outlet port 88 depending upon the processing ability and operation state of processing apparatus 32/34 due to inlet port 88 that can be used by processing apparatus 32/34 determined to one although there are a plurality.

Even if the processing ability and operation state of respective processing apparatuses 32 and 34 differ, the plurality of outlet ports 88 can be used substantially equally with respect to processing apparatus 32/34 to eliminate the problem of variation in the usage and occupancy of outlet port 88.

When there is a hand-over request of cassette 40 from processing apparatus 32/34 and a storage site in the appropriate stocker 36 is available, host computer 50 selects one of a plurality of inlet ports 88 so that inlet ports 88 is used equally, and sends a transportation task instruction to automatic carrier 38. Therefore, in the case where forward translate device 84 that functions to transfer cassette 40 at inlet port 88 to inlet delivery port 104 is defective, host computer 50 cannot detect the failure thereof so that a transportation task instruction of cassette 40 to inlet port 88 will be sent to automatic carrier 38.

To avoid this problem, host computer 50 can retain a data area in which the number of tasks not yet completed by automatic carrier 38 corresponding to each of the plurality of inlet ports 88 entered by terminal 54 is stored. The upper limit value thereof can also be specified. In sending a transportation task instruction to automatic carrier 38, host computer 50 suppresses usage of a certain inlet port 88 when the value in the data area corresponding to that port has arrived at the upper limit value. Host computer 50 searches for another inlet port 88 as the candidate. When there is no appropriate port, waiting is conducted for completion of a transportation task to inlet port 88.

Host computer 50 can set an upper limit value for each inlet port 88. In sending a transportation task instruction associated with inlet port 88, host computer 50 will no longer send an instruction corresponding to an inlet port 88 with the number of tasks not yet completed exceeding the upper limit value. The case where a plurality of transportation task instructions are accumulated at automatic carrier 38 due to failure of forward translate device 84 will not be encountered.

Further preferably, host computer 50 can retain device status data indicating the availability/unavailability of each inlet port 88. The data can be altered via operator's terminal 56. When host computer 50 sends a transportation task instruction to automatic carrier 38 with respect to an inlet port 88, host computer 50 checks the device status data to suppress usage of the certain port when the data indicates unavailability, and searches for the next perspective inlet port 88 as the candidate. When there is no appropriate port 88, host computer 50 waits for the device status data of input port 88 to be altered to "available".

The device status data indicating whether each inlet port 88 is available or not in host computer 50 can be modified through operator's terminal 56 to "unavailable" when inlet port 88 is defective. Host computer 50 can detect the defective inlet port 88 to inhibit transmission to automatic carrier 38 of a transportation task instruction with respect to the defective port 88. The case where a plurality of transportation task instructions being accumulated at automatic carrier 38 due to failure of defective inlet port 88 and the like is no longer encountered.

Automatic carrier 38 initiates a transportation task upon receiving from host computer 50 a transportation task instruction associated with inlet port 88 from processing apparatus 32/34. Automatic carrier 38 unloads cassette 40 from processing apparatus 32/34 to place cassette 40 at inlet port 88. Automatic carrier 38 confirms whether no cassette 40 is left at inlet port 88 before placing a cassette 40. Determination of an error was made when another cassette 40 is left, and the error was reported to host computer 50 immediately. There is a possibility that a cassette 40 is left on inlet port 88. Therefore, the transportation task may be frequently interrupted according to the error status reported by automatic carrier 38.

This problem can be avoided as set forth in the following. When automatic carrier 38 is to place a cassette 40 at an inlet port 88 in the case where another cassette 40 is already placed thereon, automatic carrier 38 waits for a predetermined time for that preceding cassette 40 to be unloaded without issuing an error. Automatic carrier 38 can immediately commence the task of transferring cassette 40 on transfer mount 150 of automatic carrier 38 to inlet port 88 when the preceding cassette 40 is taken away. When the preceding cassette 40 is not unloaded even at an elapse of the predetermined time, i.e. when the preceding cassette 40 is not transferred to inlet delivery port 104 by forward translate device 84, determination is made of an error status. Then, an error report can be sent to host computer 50.

Thus, host computer 50 can send to automatic carrier 38 a transportation task instruction with respect to a certain inlet port 88 without having to confirm whether that port is available or not. Also, the standby time of cassette 40 that is to be unloaded from processing apparatuses 32/34 can be reduced.

Conventionally, host computer 50 issues to automatic carrier 38 a transportation task instruction from processing apparatus 32/34 to inlet port 88 of stocker 36 after confirming whether that inlet port 88 is available. Therefore, the transportation task instruction that can be sent to automatic carrier 38 by host computer 50 is restricted to the number of ports 88. Host computer 50 will send a transportation task instruction to automatic carrier 38 as long as a storage site for cassette 40 in stocker 36 is ascertained. Therefore, there is a possibility that a great number of transportation task instructions corresponding to the number of cassette stages 172/182 of processing apparatus 32/34 will be sent to automatic carrier 38. Even if a plurality of transportation task instructions are sent from host computer 50 to automatic carrier 38, the task carried out is limited substantially to the transportation ability of automatic carrier 38. This means that a plurality of cassettes 40 will be left to be sequentially processed by automatic carrier 38. It is therefore worthless to send a plurality of task instructions exceeding this limitation. Furthermore, automatic carrier 38 is lower than host computer 50 in reliability. There was a problem that, when automatic carrier 38 corresponding to a plurality of task instructions becomes defective, the recovery time thereof is significantly time consuming.

To avoid the above problem, host computer 50 may specify via terminal 54 a predetermined limit value of the number of transportation tasks currently carried out by automatic carrier 38. Host computer 50 may also retain a data area in which the number of currently carried out tasks is stored. In sending a transportation task instruction to automatic carrier 38, host computer 50 confirms whether the number of tasks currently carried out stored in the data area is lower than the specified limit value. When the number of current tasks is smaller than the limited value, host computer 8 adds 1 to the value in that data area. When the task is completed, host computer 8 decrements the value of the data area by 1. When the value in the data area is equal to or exceeds the predetermined limit value, transmission of a transportation task instruction is deferred until the value in the data area becomes smaller than the limit value.

Host computer 50 will not send any superfluous transportation task instruction to automatic carrier 38. Therefore, the case where a plurality of transportation task instructions being accumulated at automatic carrier controller 60 due to failure of automatic carrier 38 will no longer be encountered.

According to the entry control method of cassette 40 into stocker 36, the operator places cassette 40 at inlet port 116 and manipulates operation panel 121 of stocker 36. Stocker 36 can detect that a cassette 40 has been placed at inlet port 116 by this operation. Accordingly, the information stored in ID card 72 of that cassette 40 is read out by ID reader/write 120. The read out data is sent to host computer 50 via communication cable 58. Host computer 50 becomes aware that cassette 40 is present at inlet port 116, and ascertains a storage site for cassette 40. When determination is made that cassette 40 cannot be stored, host computer 50 does not send any task instruction to stocker 36 and waits for a storage site in stocker 36 to become available. More specifically, cassette 40 is left at inlet port 116 for a storage site in stocker 36 to become available. The operator does not have to carry out the entry task of cassette 40 if he/she knows that there is no available storage site. In the case where only one port is provided to function as inlet port 116 and outlet port 118, there is a possibility that the exit task will be suppressed since there is a cassette 40 at that port to be entered.

Host computer 50 searches for a storage site of cassette 40 in stocker 36 upon receiving a report from stocker 36 that cassette 40 has arrived at inlet port 116. When a storage site cannot be ascertained, host computer 50 can neglect the arrival report. In this case, stocker 36 may present a message that a storage site cannot be ascertained to the operator on its own operation panel 121 to wait for the operator's further operation. The operator reading the message on operation panel 121 takes cassette 40 away from inlet port 116. This take-away of cassette 40 is reported to stocker 36 by operating operation panel 121. Stocker 36 identifies that cassette 40 has been taken away, and returns to the state prior to cassette 40 being placed at inlet port 116.

When a storage site for cassette 40 placed at inlet port 116 cannot be ascertained, host computer 50 can notify the same accordingly to the operator through stocker 36. Therefore, the operator can perform another process with respect to that cassette 40. Also, the problem of cassette 40 occupying the one port serving as both inlet port 116 and outlet port 118 under a similar status to prevent an exit task can be eliminated.

Host computer 50 will send to automatic carrier 38 a transportation task instruction of cassette 40 from processing apparatus 32/34 to inlet port 88 as long as there is a storage site in stocker 36 upon receiving a hand-over request from processing apparatus 32/34. Also, a transportation task instruction of cassette 40 stored in source stocker 36 to a destination stocker 36 will be sent to inter-stocker transport device 42 as long as there is an available storage site in destination stocker 36. When a report is provided from stocker 36 of arrival of cassette 40 at inlet port 116, an entry task instruction will be sent to stocker 36 if there is an available storage site at stocker 36. Furthermore, host computer 50 will issue an exit task instruction to stocker 36 if a cassette 40 to be processed is stored in stocker 36 upon receiving a load request of cassette 40 from processing apparatus 32/34. If stocker 36, automatic carrier 38, or inter-stocker transport device 42 is defective, a plurality of transportation task instructions will be sent from host computer 50 even if the task cannot be actually carried out. There was a problem that returning to the former condition, i.e. recovering from failure of the defective device and also resending the transportation task instruction, is time-consuming.

When the task is performed of storing a cassette from processing apparatus 32/34 to stocker 36, from stocker 36 to processing apparatus 32/34, and between stockers 36, host computer 50 does not have, or does not confirm prior to transmission, the device status information indicating whether the relevant processing apparatus 32/34, automatic carrier 38, inter-stocker transport device 42, and stocker related to the task 36 are available. This becomes the cause of the problem that the transportation task of cassette 40 is interrupted due to breakdown of a relating device after the task is initiated.

Similarly, in initiating an entry task via inlet port 116 and an exit task via outlet port 118, host computer 50 does not have, or does not confirm prior to sending the task instruction, the device status information indicating whether stocker 36 is available or not. This becomes the cause of the problem that the task of cassette 40 is interrupted due to breakdown of stocker 36 after initiating the task.

The above problem can be solved as set forth in the following. In the stocker entry/exit task control method, host computer 50 can retain device status data indicating whether stocker 36, automatic carrier 38, and inter-stocker transport device 42 are available or not. The device status data can be modified via operator's terminal 56. When a transportation task instruction of cassette 40 from processing apparatus 32/34 to inlet port 88 is to be sent to automatic carrier 38, host computer 50 confirms that automatic carrier 38 and stocker 36 are both available by the device status data, and then sends an entry task instruction. When a transportation task instruction of cassette 40 from source stocker 36 to destination stocker 36 is to be sent, host computer 50 confirms that source stocker 36, inter-stocker transport device 42 and destination stocker 36 are available through the device status data, and then sends an entry task instruction. When a task instruction associated with inlet port 116 is to be sent to stocker 36, host computer 50 confirms whether stocker 36 is available through the device status data, and then sends an entry task instruction. If there is at least one device that is unavailable as a result of the confirmation of the device status data, host computer 50 waits for the device to become available. Likewise in the exit task, host computer 50 sends an exit task instruction associated with outlet port 86 to stocker 36 after confirming that stocker 36 and automatic carrier 38 are available in the convey task of cassette 40 from stocker 36 to processing apparatus 32/34. Furthermore, an exit task instruction associated with outlet port 118 is sent to stocker 36 after confirming that stocker 36 is available.

The instruction of a transportation task is sent to stocker 36, automatic carrier 38, or inter-stocker transport device 42 after confirming that all the devices related to the transportation task to the storage site of stocker 36 which is the final destination or a relevant device is available. Therefore, the case where a plurality of transportation task instructions is accumulated at a transportation device that does not work due to failure is eliminated. Also, the task will not be suppressed during the operation.

According to this stocker entry task control method of sending a transportation task instruction after confirming that all the devices related to the transportation task are available, a standby state will be attained when the device status data of stocker 36 indicates that it is unavailable in entering a cassette 40 through inlet port 116. There is a problem that the operator cannot cancel the entry task of that cassette 40.

The above problem can be eliminated as set forth in the following. When host computer 50 confirms the device status data of stocker 36 upon receiving an arrival report of cassette 40 at inlet port 116 from stocker 36 to become aware that stocker 36 is unavailable, host computer 50 can notify stocker 36 that it is unavailable and neglect the report of the arrival of cassette 40. Stocker 36 receiving the report can provide a display to operator on operation panel 121 that storage cannot be performed to wait for an operation by the operator. The operator reading the display on operation panel 121 takes cassette 40 away from inlet port 116, and notifies that cassette 40 is taken away to stocker 36 by operating operation panel 121. In response, stocker 36 determines that cassette 40 is taken away. A state is attained of the former condition prior to cassette 40 being placed at inlet port 116.

When cassette 40 at inlet port 116 cannot be stored since the device status data of stocker 36 indicates that it is unavailable, host computer 50 notifies the operator accordingly through stocker 36. The state prior to cassette 40 placed at inlet port 116 can be attained. Therefore, the operator can apply a different process for cassette 40.

Inlet port 116 of stocker 36 can be used independent of processing apparatus 32/34. It is not necessary to provide data of an available processing apparatus 32/34 corresponding thereto through terminal 54 as in the conventional case. Furthermore, two cassettes 40 can be placed together at one time, which is determined by taking account of the favorable workability of the operator.

When the operator is to store a cassette 40 in stocker 36, first the maximum number of 2 cassettes 40 is placed at inlet port 116. Then, operation panel 121 provided integrally with stocker 36 is manipulated. The operator can place cassette 40 at the same port irrelevant to processing apparatus 32/34 completing the process on cassette 40 or processing apparatus 32/34 that will carry out the next process. Stocker 36 being notified that cassette 40 is placed at inlet port 116 by this operation has the information stored in ID card 72 of cassette 40 read by ID card reader/writer 120. The read out data is sent to host computer 50 via communication cable 58.

Host computer 50 will not confirm whether cassette 40 can be entered through the port as in the conventional case, and sends an entry task instruction to stocker 36 after ascertaining the storage site. According to the entry task instruction sent through communication cable 58, stocker controller 64 initiates the task after confirming a storage site on stocker shelf 96.

Stocker 36 initiating the entry task has the first and second cassettes 40 mounted at inlet port 116 carried to the storage site on stocker shelf 96 by stocker crane 80. When the designated task is completed, stocker 36 sends a task complete report to host computer 50. Thus, the entry task by an operator is completed.

The number of cassette 40 that can be placed at inlet port 116 of stocker 36 can be set to 2. Two cassettes are the appropriate number considering the workability of the operator. It is not necessary to set the available processing apparatus 32/34 for each port 116 via host computer 50. Thus, the workability of the entry task of cassette 40 to stocker 36 by the operator is improved.

The problem of variation in the usage and occupancy of inlet port 116 depending upon the processing ability and operation state of processing apparatus 32/34 in the case where there are a plurality of inlet ports 116 with the number of inlet ports 116 that can be used by processing apparatus 32/34 limited to 1.

Thus, the available inlet port 116 can be used according to an arbitrary selection by the operator.

Host computer 50 does not have the information regarding the storage site of each cassette 40 in stocker 36. The administration of the storage site is left to stocker controller 64. The storage site was identified by adding the number of output cassettes 40 to the value of the stocker capacity and subtracting the input number of cassettes 40 from the value of the stocker capacity on the basis of the maximum number of cassettes that can be stored in stocker 36.

The information associated with the labeled storage site of a stocker 36 is applied in advance to host computer 50 through terminal 54 as shown in FIGS. 7A and 7B. Host computer 50 receives a report of the storage site when a storage task of cassette 40 is completed from stocker 36. According to the information reported from stocker controller 64 when cassette 40 is unloaded from stocker shelf 96 by stocker crane 80, host computer 50 can detect that the storage site where the unloaded cassette 40 was stored is now available.

Host computer 50 can specify through terminal 54 a plurality of outlet ports 86 for usage by one processing apparatus 32/34. Also, the usage sequence can be set. For example, in the case of FIG. 1, two outlet ports 86 are set available for processing apparatus 32/34. Processing apparatus 32/34 sends a load request of cassette 40 to host computer 50 via communication cable 58. Host computer 50 determines an outlet port 86 that is in the order subsequent to the outlet port 86 that was previously used or the first outlet port 86 when there is no outlet port 86 of the subsequent order out of the plurality of outlet ports 86 as the outlet port to be used for the transportation task of cassette 40.

According to the stocker exit task control method, a plurality of outlet ports 86 can be assigned to one processing apparatus 32/34. The usage frequency of the outlet ports 86 can be equalized by using ports 86 in the predetermined order. Thus, the following problem encountered in conventional cases can be solved.

More specifically, there was a problem of variation in the usage and occupancy of automatic outlet port 86 depending upon the processing ability and operation state of processing apparatus 32/34 when there are a plurality of outlet ports 86 with the number of outlet port 86 that can be used by processing apparatus 32/34 limited to one. This problem is solved in the present application. Even when the processing ability and operation state of each of processing apparatuses 32/34 differ, the usage of the plurality of outlet ports 86 by processing apparatus 32/34 can be equalized to avoid the problem of variation in the usage and occupancy of automatic port 86.

Preferably, host computer can specify a plurality of outlet ports 86 that can be used by one processing apparatus 32/34 through terminal 54. Host computer 50 can include a data region in which the number of exit task instructions issued from stocker 36 that has not yet been completed is stored corresponding to each port 86. Upon receiving a cassette load request from processing apparatus 32/34, host computer 50 searches for outlet port 86 that is available for processing apparatus 32/34. When there are a plurality of available outlet ports 86 as a result of the search, host computer 50 compares the value in the data area associated with each port to select a particular outlet port 86 with the smaller value. The value in the data area associated with the selected port 86 is incremented by 1, and a transportation task instruction is sent to automatic carrier 38. When the task is completed, that value in the data area corresponding to that port 86 is decremented by 1. When there are a plurality of outlet ports 86 corresponding to the same value, host computer 50 selects an arbitrary one of the plurality of ports 86, and sends a transportation task instruction to automatic carrier 38.

According to the stocker exit task control method, a plurality of outlet ports 86 can be assigned to one processing apparatus 32/34. An exit task instruction is sent to another stocker 36 so that the number of tasks not yet completed with respect to port 86 is equal. Thus, the usage frequency of port 86 can be substantially equalized.

The problem can be eliminated of variation in the usage and occupancy of outlet port 86 depending upon the processing ability and operation state of processing apparatus 32/34 when there are a plurality of outlet ports 86 with the number of outlet port 86 that can be used by processing apparatus 32/34 limited to 1.

Even when the processing ability and operation status of processing apparatus 32/34 differ, the plurality of outlet ports 86 can be used substantially in an equal frequency with respect to processing apparatus 32/34. Thus, the problem of variation in the usage and occupancy of outlet port 86 can be eliminated.

When there is a load request from processing apparatus 32/34 of a cassette 40 in the above-descried stocker exit task control method, host computer 50 selects one outlet port 86 out of the plurality of outlet ports 86 in an equal manner when there is at least one cassette 40 that is to be processed in stocker 36, and sends an exit task instruction to stocker 36. Therefore, in the case where forward translate device 84 that transfers cassette 40 from outlet delivery port 100 to outlet port 86 is defective, host computer 50 cannot detect the failure and will send an exit task instruction of cassette 40 related to outlet port 86 to automatic carrier 38.

To avoid this problem, host computer 50 can retain a data area storing the number of exit tasks that are not yet completed by stocker 36 with respect to each of outlet ports 86, and set the upper limit value of the number of tasks through terminal 54.

In the phase of sending to stocker 36 an exit task instruction related to outlet port 86, host computer 50 cancels the usage of that outlet port 86 when the value in the data area associated with that outlet port has arrived at the specified upper limit value and attempts to use the next prospective outlet port 86. When there is no appropriate outlet port, waiting is conducted for completion of a transportation task associated with an available outlet port.

Host computer 50 can set the upper limit value of the number of tasks not yet completed for each outlet port 86. Therefore, the case where the number of tasks not yet completed exceeding the upper limit value will not occur in the phase of sending an exit task instruction associated with outlet port 86. Also, the case where a plurality of exit task instructions are accumulated at stocker 36 due to failure of forward translate device 84 will no longer occur.

Preferably, host computer 50 retains device status data indicating whether each outlet port 86 is available or not. The data can be altered via terminal 56. In the phase of sending a transportation task instruction associated with outlet port 86 to stocker 36, host computer 50 checks the device status data to cancel usage of the corresponding outlet port 86 when data indicates that it is unavailable. Usage of the next prospective outlet port 86 is taken as the candidate. When there is no available outlet port 86, waiting is conducted until the device status data of the unavailable outlet port 86 is altered to data indicating "available".

Since host computer 50 retains device status data indicating whether each outlet port 86 is available or not, the data of an outlet port 86, when defective, can be altered to "unavailable" by an operator through terminal 56. Therefore, host computer 50 can detect a defective outlet port 86, and cancel transmission of an exit task instruction associated with that port to stocker 36. Furthermore, the circumstance where a plurality of exit task instructions being accumulated at stocker 36 due to failure of forward translate device 84 can longer be encountered.

During the exit task phase with respect to stocker 36 in response to a load request of cassette 40 from processing apparatus 32/34, host computer 50 can send to automatic carrier 38 a transportation task instruction of cassette 40 associated with outlet port 86 to processing apparatus 32/34 even if the exit task is not yet completed, according to the information indicating the task progress that is reported from stocker 36 during the task, i.e., from the beginning to the end of the task.

Host computer 50 receives a load request of cassette 40 from processing apparatus 32/34 to send an exit task instruction associated with outlet port 86 to stocker 36. Host computer 50 can also send a transportation task instruction to automatic carrier 38 of the current cassette 40 to processing apparatus 32/34 associated with outlet port 86 before the exit task is completed. This means that a forward task of automatic carrier 38, i.e. a shifting task of automatic carrier 38 from the standby location to the source of transportation, can be carried out parallel to the exit task by stocker 36.

When the exit task with respect to output port 86 is completed, a transportation task instruction associated with the same port 86 to processing apparatus 32/34 is sent to automatic carrier 38. Therefore, the problem of cassette 40 left at outlet port 86 during the travel of automatic carrier 38 from the standby location to that port 86 can be avoided.

Thus, the time required for the transportation task of cassette 40 from outlet port 86 to processing apparatus 32/34 can be shortened.

Conventionally, upon receiving from host computer 50 a transportation task instruction of cassette 40 from outlet port 86 to processing apparatus 32/34, automatic carrier 38 initiates that task to move from the standby location to the position in front of outlet port 86 of the specified stocker 36. Then, automatic carrier 38 commences the operation of unloading cassette 40 from outlet port 86. Automatic carrier 38 confirms whether cassette 40 is placed on outlet port 86 before this unloading operation. Determination of an error status is made when there is no cassette 40 on outlet port 86. An error is immediately reported to host computer 50.

Consider the case where host computer 50 sends a task instruction to automatic carrier 38 prior to completion of the exit task of cassette 40 through outlet port 86. There is a possibility of cassette 40 not being placed on outlet port 86 when automatic carrier 38 arrives at outlet port 86. In such a case, automatic carrier 38 will issue an error to frequently interrupt the transportation task.

This problem is avoided as set forth in the following. Automatic carrier 38 receives from host computer 50 a transportation task instruction of cassette 40 to processing apparatus 32/34 from outlet port 86 of stocker 36, and then initiates the transportation task. In the phase of automatic carrier 38 moving from the standby site to outlet port 86 of the source stocker to unload cassette 40 on outlet port 86, automatic carrier 38 can suppress issue of an error even if the relevant cassette 40 is missing and waits for cassette 40 for a predetermined time. When cassette 40 is provided on outlet port 86 within the predetermined time, automatic carrier 38 immediately initiates the operation of unloading cassette 40 from outlet port 86 onto transfer mount 150 of automatic carrier 38. When a relevant cassette 40 is not placed on port 86 at an elapse of the predetermined time, i.e., when cassette 40 is not transferred from outlet delivery port 100 by forward translate device 84, determination is made of an error, and an error report is sent to host computer 50.

By virtue of the above-described mechanism, host computer 50 can send a transportation task instruction to automatic carrier 38 of cassette 40 from outlet port 86 to processing apparatus 32/34 before the exit task of cassette 40 to outlet port 86 is not completed. Therefore, the standby time of processing apparatus 32/34 issuing the load request can be reduced.

Host computer 50 sends to automatic carrier 38 a transportation task instruction of cassette 40 from processing apparatus 32/34 to inlet port 88. Automatic carrier 38 receiving the task instruction initiates the transportation task to unload cassette 40 from cassette stage 172/182 of processing apparatus 32/34 and carries cassette 40 to inlet port 88 of the destination stocker 36. Processing apparatus 32/34 sends a load request of cassette 40 to host computer 50 when the previous cassette 40 on cassette state 172/182 is unloaded by automatic carrier 38.

In response to the load request, host computer 50 searches for a cassette 40 to be processed from stocker 36. An exit task of cassette 40 to outlet port 86 is carried out by stocker 36. Then, a transportation task instruction of cassette 40 from outlet port 86 to processing apparatus 32/34 is sent to automatic carrier 38. As described with reference to FIG. 8, automatic carrier 38 includes at least two cassette transfer mounts 150. Automatic carrier 38 moves to processing apparatus 32/34 with cassette 40 on transfer mount 150, and places cassette 40 on cassette stage 172/182 that is requested to be handed over onto cassette transfer mount 150. Automatic carrier 38 can also place the carried cassette 40 on cassette transfer mount 150 to the now-empty cassette stage 172/182. However, host computer 50 sends a transportation task instruction of cassette from processing apparatus 32/34 to inlet port 88 and a transportation task instruction of cassette 40 from outlet port 86 to processing apparatus 32/34 individually to automatic carrier 38, whereby cassette 40 was transferred accordingly.

To improve this disadvantageous event, host computer 50 can provide control as set forth in the following. When host computer 50 receives a hand-over request of cassette 40 from processing apparatus 32/34, host computer 50 searches for a cassette 40 to be processed in stocker 36. Host computer 50 will not send a single transportation task instruction to automatic carrier 38 from processing apparatus 32/34 to inlet port 80. First, host computer 50 sends to stocker 36 an exit task instruction of a cassette 40 that can be processed via outlet port 86. Upon receiving an exit task complete report, host computer 50 sends to automatic carrier 38 a transportation task instruction of cassette 40 from processing apparatus 32/34 to inlet port 88 and a transportation task instruction of cassette 40 from outlet port 86 to processing apparatus 32/34 as one transportation task instruction.

Automatic carrier controller 60 receiving a transportation task instruction corresponding to two transportation tasks provides control so that automatic carrier 38 heads towards outlet port 86 of stocker 36. Automatic carrier 38 places cassette 40 on output port 86 onto transfer mount 150 using arm 144, hand 146, and hand claw 148. Then, automatic carrier 38 moves towards processing apparatus 32/34. Arriving at processing apparatus 32/34, automatic carrier 38 first places cassette 40 on cassette stage 172/182 onto its empty transfer mount 150 using arm 144, hand 146, and hand claw 148 as in the prior case, leaving the carried cassette 40 on transfer mount 150. When the task is completed, cassette 40 fetched from output port 86 and placed on transfer mount 150 is unloaded onto cassette stage 172/182. Then, automatic carrier controller 60 provides control so that carriage 140 approaches inlet port 88 of stocker 36. When carriage 140 arrives at inlet port 88, cassette 40 on transfer mount 150 is unloaded at inlet port 88 to complete the series of the task.

Automatic carrier controller 60 sends an appropriate report to host computer 50 when cassette 40 is placed at processing apparatus 32/34. Host computer 50 is notified that cassette 40 has arrived at processing apparatus 32/34 by this report. Then, host computer 50 sends a process start task instruction to processing apparatus 32/34 via communication cable 58.

In response to a hand-over request of cassette 40 from processing apparatus 32/34, host computer 50 searches for a cassette 40 to be processed that is stored in stocker 36, and sends a transportation task instruction to one automatic carrier 38 with 2 cassettes 40 as a pair. Automatic carrier 38 receiving this transportation task instruction carries out the series of tasks in the sequence of the fetching task of cassette on outlet port 86, the fetching task of cassette 40 on processing apparatus 32/34, the unloading task of cassette 40 on transfer mount 150 to processing apparatus 32/34, and the unloading task of processed cassette 40 from transfer mount 150 to inlet port 88. In comparison with the case where the transportation task of cassette 40 from processing apparatus 32/34 to inlet port 88 and the transportation task of cassette 40 from outlet port 86 to processing apparatus 32/34 are carried out separately by automatic carrier 38, the time required for the transportation task can be reduced. Therefore, the rate of operation of automatic carrier 38 can be reduced and cassette 40 can be supplied to processing apparatus 32/34 quickly.

Host computer 50 can specify a plurality of outlet ports 118 that can be used with respect to one processing apparatus 32/34 through terminal 54. Also, the usage sequence thereof can be specified together. Two outlet ports 118 can be assigned to be used by processing apparatus 32/34. When a load request of cassette 40 is transmitted from processing apparatus 32/34 to host computer 50 via communication cable 58, host computer 50 selects outlet port 118 that is in the order subsequent to the previously used outlet port 118, or the first outlet port 118 when there is no subsequent order specified. The selected outlet port 118 is determined to be used for that transportation task of cassette 40.

According to the stocker exit task control method, a plurality of outlet ports 118 can be assigned to one processing apparatus 32/34. It is therefore possible to set the usage frequency of outlet port 118 equal according to the predetermined sequence.

The problem is solved of variation in the usage and occupancy of outlet port 118 depending upon the processing ability and operation state of processing apparatus 32/34 when there are a plurality of outlet ports 118 with the number of outlet ports 118 that can be used by processing apparatus 32/34 limited.

Therefore, even if the processing ability and operation status of processing apparatus 32/34 differ, outlet port 118 can be used in substantially an equal frequency by each of processing apparatuses 32/34. The problem of variation in the usage and occupancy of outlet port 118 is eliminated.

Preferably, host computer 50 can specify a plurality of outlet ports 118 that can be used by one processing apparatus 32/34 through terminal 54. Also, host computer 50 can retain a data area in which the number of exit tasks instructions not yet completed out of the plurality of exit transportation instructions issued from stocker 36 is stored with respect to each outlet port 118.

Upon receiving a cassette load request from processing apparatus 32/34, host computer 50 searches for an outlet port 118 that is available by processing apparatus 32/34. When there are a plurality of available outlet ports 118, host computer 50 compares the value stored in the data area for each port 118 and selects the outlet port 118 corresponding to the smallest value. Host computer 50 adds 1 to the value in the data area associated with the selected port 118, and sends a transportation task instruction to stocker 36. When the task is completed, host computer 50 subtracts 1 from the value in the data area. When there are a plurality of outlet ports 118 corresponding to the smallest value, host computer 50 selects an arbitrary one of the ports corresponding to the smallest value.

According to the stocker exit task control method, a plurality of outlet ports 118 can be assigned to one processing apparatus 32/34 by host computer 50. Host computer 50 sends an exit task instruction to a stocker 36 so that the number of tasks not yet completed is equal. Therefore, the usage frequency of outlet port 118 can be substantially equalized.

The problem is solved of variation in the usage and occupancy of outlet port 118 depending upon the processing ability and operation status of processing apparatus 32/34 when there are a plurality of outlet ports 118 with the number of outlet ports 118 that can be used by processing apparatus 32/34 limited.

Even when the processing ability and operation status of each of processing apparatuses 32/34 differ, outlet port 118 can be used substantially equally with respect to processing apparatus 32/34. The problem of variation in the usage and occupancy of outlet port 118 is solved.

Upon receiving an exit task instruction of cassette 40 associated with outlet port 86 or outlet port 118 from host computer 50 via communication cable 58, stocker 36 can initiate the transportation task and also report to host computer 50 via communication cable 58 the progress status when the task is initiated, when cassette 40 is unloaded from stocker shelf 96 by stocker crane 80, and when the task is completed. Stocker 36 can also send a report through communication cable 58 to inter-stocker transport device controller 66 of the task progress status when the task is initiated, when cassette 40 is unloaded from stocker shelf 96 by stocker crane 80, and when the task is completed, in response to a transfer task instruction of cassette 40 from inter-stocker transport device controller 66 to port 98 via communication cable 58.

Inter-stocker transport device controller 66 sends a progress status report of the inter-stocker transportation task instruction to host computer 50 through communication cable 58. Host computer 50 defers sending to stocker 36 and inter-stocker transport device 42 an exit task instruction and inter-stocker transportation task instruction associated with the same port until a task progress report indicating that stocker crane 80 has unloaded cassette 40 from stocker shelf 96.

As to the task instruction provided from host computer 50 to stocker 36 and inter-stocker transport device 42, stocker 36 sends a report indicating that stocker crane 80 has unloaded cassette 40 from stocker shelf 96. Also, host computer 50 defers sending an exit transportation instruction and an inter-stocker transportation task instruction to stocker 36 and inter-stocker transport device 42 associated with the same port until receiving a progress report indicating that stocker crane 80 has unloaded cassette 40 from stocker shelf 96. Therefore, the advantage that host computer 50 does not send an excessive amount of task instructions to stocker 36 and inter-stocker transport device 42, and the advantage that stocker 36 and inter-stocker transportation device 42 are not left idle in a task standby state consist together.

The problem that the aimed number of tasks cannot be carried out due to suppression of a task instruction from host computer 50 despite the sufficient transportation ability of stocker 36 and inter-stocker transportation device 42 can be solved. Also, the problem is solved of host computer 50 sending too many number of task instructions irrespective of the task progress of stocker 36 and inter-stocker transport device 42 to delay recovery to the proper condition when stocker 36 and inter-stocker transport device 42 are defective.

Host computer 50 retains data indicating the current progress status of cassette 40 in stocker 36 to identify an available storage site therein. However, there is a possibility that this data differs from the actual current progress data of cassette 40 retained by stocker controller 64 due to communication line error between host computer 50 and stocker controller 64, or data loss due to system-failure of host computer 50. In such a case, host computer 50 will erroneously consider that there is an available site for storage of cassette 40 in stocker 36. Therefore, host computer 50 responds to a hand-over request of cassettes 40 from processing apparatus 32/34 to have automatic carrier 38 carry cassette 40 from processing apparatus 32/34 to inlet port 88. When that task is completed, host computer 50 sends an entry task instruction of that cassette 40 to stocker 36. However, cassette 40 on inlet port 88 cannot be stored since there is actually no available storage site in stocker 36 to result in interruption of the task. A similar case can be expected in the inter-stocker transportation task of cassette 40. In this case, cassette 40 arriving at port 98 cannot be stored since there is no storage site to result in interruption of the task. In the case where there is a cassette 40 on inlet port 116, host computer 50 will assume that there is an available space in stocker 36 and send an entry task instruction to stocker 36. However, the task will be interrupted since there is actually no empty space. There is also a possibility that host computer 50 will assume that stocker 36 is filled up with cassette 40 although there is an available space in stocker 36 to defer initiation of a task associated with entry.

It is indispensable to quickly identify the difference between the current progress data of cassette in stocker 36 under administration of host computer 50 and the current progress data under administration of stocker controller 64 in order to reduce the interrupted time of the task associated with the stocker 36 in question.

The problem is solved as set forth in the following. In response to an instruction from an operator through terminal 56, host computer 50 has the ID data of all cassettes 40 stored in stocker 36 to be reported with respect to the specified stocker controller 64. This instruction is transmitted to stocker controller 64 via communication cable 58. In response, stocker controller 64 sends a report of all the current progress data of cassette 40 to host computer 50 via communication cable 58. Host computer 50 compares its own ID data of cassette 40 stored in the relevant stocker 36 with the current progress data reported from stocker controller 64. Any difference is indicated on the display of terminal 56 to notify the operator.

In the case where cassette 40 is left at inlet port 88, port 98, or inlet port 116 to prevent execution of an entry task, or where an entry task is not initiated although there is an available storage site in stocker 36, host computer 50 compares its own ID data of cassette 40 stored in stocker 36 with the ID data of cassette 40 retained by stocker controller 64 according to an instruction from the operator through terminal 56. The difference as a result of this collation can be provided on the display of terminal 56 to inform the operator where the problem resides. The operator can take appropriate measures to recover from the interrupted state by referring to the ID data of stocked cassette 40 retained by host computer 50 and that retained by stocker controller 64.

When host computer 50 interrogates stocker controller 64, an interrogation about all the ID data for one stocker can be conducted together at one time. However, when the amount of data is great, it is possible to conduct an interrogation according to the stocker unit of STK01 to STK04 as shown in FIGS. 7A and 7B.

According to an instruction entered by the operator through terminal 56, host computer 50 interrogates stocker controller 64 about the ID data of cassette 40 stored in stocker 36. That ID data is compared with the ID data retained in host computer 50 with respect to cassette 40 stored in stocker 36. Difference in the ID data as a result of this collation may be caused by discrepancy where host computer 50 assumes that there is a cassette 40 whereas stocker controller 64 assumes that there is no cassette 40, or vise versa. Host computer 50 provides a display of difference in ID data on terminal 56 without discrimination therebetween.

When the data of stocker controller 64 is correct, the operator adds to the data of host computer 50 through terminal 56 the data of cassette 40 assumed to be absent by host computer 50. Conversely, the operator deletes from the data of host computer 50 through terminal 56 the data of cassette 40 assumed to be present by host computer 50. The process to be carried out with respect to the two causes differ from each other. However, host computer 50 will not provide a result discriminated according to the two causes on terminal 56. There was a problem that recovery of ID data of host computer 50 by the operator is time consuming.

This inconvenience can be eliminated as set forth in the following. In the phase of comparing the data reported from stocker 36 about cassette 40 stored therein with the ID data retained in host computer 50, host computer 50 can provide on terminal 56 the discrimination between the ID data of cassette 40 assumed to be present by host computer 50 and assumed to be absent by stocker controller 64, and the ID data of cassette 40 assumed to be absent by host computer 50 and assumed to be present by stocker controller 64.

By providing the above discrimination on terminal 56, the operator can clearly identify the contents for the recovery task to reduce the time required therefore.

The above-described host computer 50 responds to an instruction from the operator through terminal 56 to interrogate stocker controller 64 about ID data of cassette 40 stored in stocker 36, whereby the ID data of cassette 40 stored in stocker 36 retained by host computer 50 is compared with that of stocker controller 64. The differing data as a result of the collation is directly provided on terminal 56. Therefore, the operator must approach terminal 56 to modify the data retained by host computer 50.

This inconvenience can be eliminated as set forth in the following. In addition to providing the compared result on terminal 56, host computer 50 can have all the ID data with respect to cassette 40 stored in stocker 36 retained therein rewritten by the ID data in the report sent from stocker controller 64 upon permission from the operator through terminal 56.

Accordingly, the operator can carry out at one time the task of adding or deleting ID data of cassette 40 stored in stocker 36 for host computer 50. The recovery time from a trouble can be reduced significantly.

According to an instruction from an operator through terminal 56, host computer 50 interrogates stocker controller 64 about the current progress data of cassette 40 stored in stocker 36. Host computer 50 compares its own current progress data with the current progress data of cassette 40 retained by stocker controller 64. Here, only the ID data of cassette 40 stored in stocker 36 is compared. Therefore, in the case where host computer 50 also administers the storage site of cassette 40 in stocker 36, the difference between the storage site of cassette 40 assumed by stocker controller 64 and the storage site of cassette 40 assumed by host computer 50, if any, will not induce any inconsistency as the result of collation by host computer 50. This difference is not provided on the display of terminal 56.

This inconvenience can be avoided as set forth in the following. In response to an interrogation about the current progress data of cassette 40 from host computer 50, stocker 36 returns a report of the ID data of cassette 40 and the stocker unit number, shelf number, and position number identifying the storage site to host computer 50. Host computer 50 compares the received data with its own data, i.e. the ID data of cassette 40 which is the current progress data of stocker 36, and the stocker unit number, shelf number, and position number indicating the storage site retained by host computer 50 to confirm whether there is difference in the storage site data in addition to difference in the ID data. Host computer 50 provides a display on terminal 56 for any discrepancy between the data.

By virtue of the above mechanism, the difference in the current progress data of cassette 40 stored in stocker 36 between host computer 50 and stocker controller 64 can be identified on the storage site basis. Furthermore, it is possible to detect a cassette 40 in question even in a stocker 36 of a great capacity.

Figure 14:
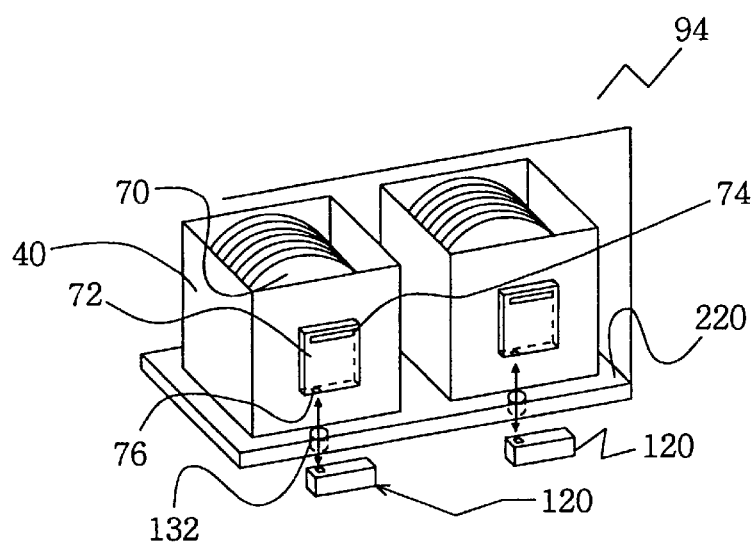
FIG. 14 is a diagram for describing an outlet port for manual output of stocker 190.
Figure 12:
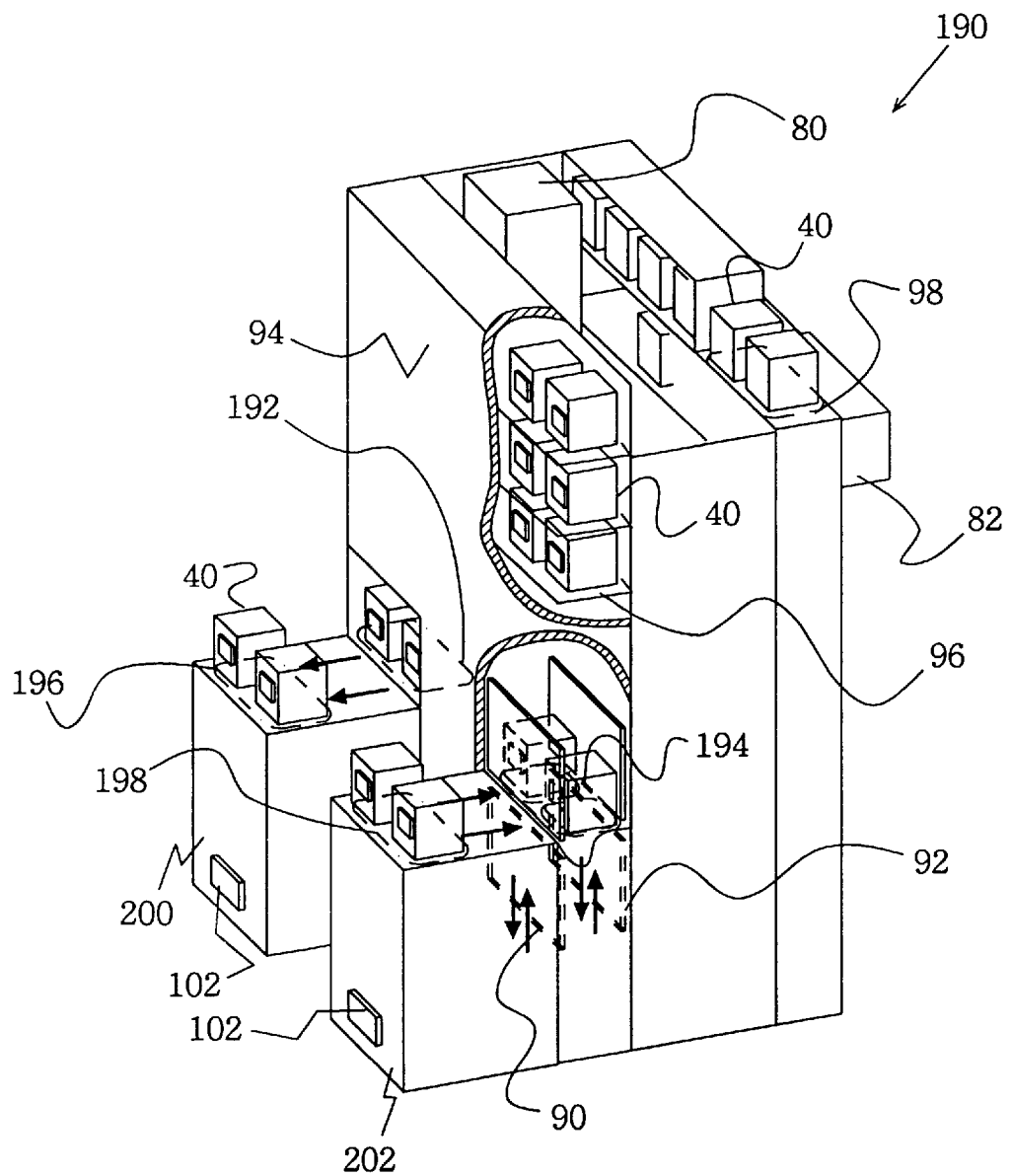
FIGS. 12 and 13 show a stocker 190 viewed from an automatic carrier side and an operator side, respectively.

An example of another structure of a stocker will be described hereinafter with reference to FIGS. 12–14.

A stocker 190 includes an automatic carrier related outlet port 196 similar to outlet port 86 of stocker 36. In stocker 190, the number of cassettes 40 that can be mounted on port 196 is set to be equal to the maximum number of cassettes requested to be loaded from processing apparatus 32/34, i.e. the maximum number of cassettes unloaded to outlet port 196. Here, two cassettes 40 can be mounted at port 196.

Processing apparatus 32/34 sends to host computer 50 through communication cable 58 a load request of cassette 40. Here, processing apparatus 32/34 requests the load of two cassettes 40 corresponding to the processing unit of that processing apparatus 32/34. In response, host computer 50 identifies whether there is a cassette 40 in stocker 190 that can be processed by processing apparatus 32/34. When there are two or more cassettes 40 that can be processed in stocker 190, the number of cassettes to be output is specified to 2, and an exit task instruction of two cassettes 40 to outlet port 196 is sent to stocker controller 64.

Stocker controller 64 has the first cassette 40 transferred to outlet delivery port 192 using stocker crane 80. Stocker controller 64 then drives forward translate device 200 so that cassette 40 on outlet delivery port 192 is forwarded to outlet port 196. In parallel to the exit task of the first cassette 40, the exit task of the second cassette 40 is carried out according to a similar procedure at a different mounting point. When the two cassettes are output at outlet port 196, stocker controller 64 sends a task complete report to host computer 50.

In response, host computer 50 sends an instruction through communication cable 58 to automatic carrier 38 to have the two cassettes 40 on outlet port 196 carried to cassette stage 172/182 of processing apparatus 32/34. Automatic carrier controller 60 receiving this instruction assigns an appropriate one of the plurality of carriers 38 that is most suitable for the transportation task. The transportation task of cassette 40 is carried out by radio communication using control station side communication unit 62 and carrier communication unit 142.

The transportation task of cassette 40 by automatic carrier 38 will be described hereinafter. Initially, carriage 140 heads for outlet port 196 of the source stocker 190 from the standby state according to guide tape 156 affixed to the floor. When carriage 140 arrives at outlet port 196, automatic carrier 38 confirms whether the first cassette 40 is present at outlet port 196 via an automatic carrier-directed communication unit 102. If the first cassette 40 is present, automatic carrier 38 drives arm 144, hand 146 and hand claw 148 to fetch the first cassette 40 on outlet port 196 onto its own transfer mount 150. A similar procedure is carried out for the second cassette 40. The second cassette 40 is placed on another transfer mount 150 of automatic carrier 38. When this mounting task is completed, carriage 140 moves towards the designated cassette stage 172/182 of the destination processing apparatus 32/34 from stocker 190. When carriage 140 arrives at cassette stage 172/182, automatic carrier 38 sequentially places cassette 40 on transfer mount 150 onto the designated cassette stage 172/182 in a procedure opposite to that described above. When all the specified task is completed, automatic carrier controller 60 sends to host computer 50 via communication cable 58 a task complete report.

Host computer 50 receiving a report from automatic carrier 38 that the transfer task of two cassettes 40 to processing apparatus 32/34 has been completed sends a process start instruction to processing apparatus 32/34 via communication cable 58.

By setting the number of cassettes 40 that can be mounted on outlet port 196 in stocker 190 identical to the number of cassettes 40 requested to be loaded by processing apparatus 32/34 associated with that outlet port 196, the series of tasks such as the exit task of cassette 40 from the storage site of stocker 190 to outlet port 196 and the transportation task of cassette 40 from outlet port 196 to cassette stage 172/182 of processing apparatus 32/34 can be carried out on the basis of the number of cassettes requested to be loaded by processing apparatus 32/34.

The inconvenience of, in the case where the unit of cassettes requested to be loaded from processing apparatus 32/34 is greater than the number of cassettes that can be mounted on outlet port 196, the remaining cassette 40 exceeding the predetermined number of cassette being transferred at a subsequent task is avoided. The problem of cassette 40 already arriving at cassette stage 172/182 of processing apparatus 32/34 not being able to be processed by processing apparatus 32/34 until a succeeding cassette 40 arrives is eliminated.

Initiation of the process of cassette 40 on cassette stage 172/182 by processing apparatus 32/34 due to a delayed succeeding cassette 40 will no longer be deferred.

Stocker 190 further includes an automatic carrier related inlet port 198 similar to inlet port 88 of stocker 36. In stocker 190, the number of cassettes that can be mounted at inlet port 198 is set to be identical to the maximum number of cassettes requested to be handed over by processing apparatus 32/34. Here, two cassettes 40 can be placed on port 198.

Processing apparatus 32/34 carries out the hand-over request of cassette 40 by two cassettes at a time. After host computer 50 ascertains a storage site in stocker 190 for cassette 40, a transportation task instruction is sent to automatic carrier 38 at one time. Automatic carrier controller 60 receiving from host computer 50 a transportation task instruction of the maximum number of two cassettes 40 assigns one of the plurality of automatic carriers 38 that is most suitable for the transportation task. A transportation task is carried out via radio communication using control station side communication unit 62 and carrier communication unit 142.

The transportation task of cassette 40 by automatic carrier 38 will be described hereinafter. Initially, carriage 140 heads for processing apparatus 32/34 from which cassette 40 is to be unloaded according to guide tape 156 affixed to the floor from the standby site. When carriage 140 arrives at processing apparatus 32/34, automatic carrier 38 confirms whether there is a cassette 40 on cassette stage 172/182 via an automatic carrier-directed communication unit 174. If there is a cassette 40 on cassette stage 172/182, automatic carrier 38 drives arm 144, hand 146 and hand claw 148 to fetch the first cassette 40 on cassette stage 172/182. The first cassette 40 is placed on transfer mount 150 of automatic carrier 38. In a similar manner, the second cassette 40 is mounted onto another transfer mount 150 from cassette stage 172/182. When the mounting task of the two cassettes 40 is completed, carriage 140 moves towards the specified inlet port 198 of the destination stocker 190 from the source processing apparatus 32/34. Arriving at inlet port 198, the two cassettes 40 are sequentially placed from transfer mount 150 to inlet port 198 in a procedure opposite to that above. When all the specified tasks are completed, automatic carrier controller 60 sends a task complete report to host computer 50 via communication cable 58.

Host computer 50 receiving a task complete report from automatic carrier 38 provides an entry task instruction of two cassettes 40 through inlet port 198 with respect to stocker 190. Stocker controller 64 responds to this entry task instruction sent via communication cable 58 to ascertain a storage site of cassette 40 on stocker shelf 96 and then commences the entry task. Stocker 190 has forward translate device 202 driven to transfer the first cassette 40 from inlet port 198 to inlet delivery port 194. When this transfer task is completed, stocker crane 80 is actuated to carry cassette 40 on inlet delivery port 194 to the set storage site on stocker shelf 96 ascertained by stocker controller 64. The exit task of the second cassette 40 is carried out in parallel to the task of the first cassette 40 at a different mounting point according to the same procedure. The series of the task is completed when the second cassette is stored at the storage site on stocker shelf 96. Stocker controller 64 sends a task complete report through communication cable 58 to host computer 50.

By setting the number of cassettes 40 that can be mounted on inlet port 198 of stocker 190 identical to the number of cassettes 40 requested to be handed over by processing apparatus 32/34 that can use that port 198, the series of tasks such as the transportation task of cassette 40 from processing apparatus 32/34 to inlet port 198 and the entry task of cassette 40 from inlet port 198 to the storage site in stocker 190 can be carried out on the basis of the number of cassettes requested to be handed over by processing apparatus 32/34.

Therefore, the problem of, when the unit of cassettes requested to be handed over by processing apparatus 32/34 is greater than the number of cassettes that can be mounted at inlet port 198, processed cassettes 40 exceeding the number of cassettes that can be mounted at inlet port 198 being left at cassette stage 172/182 of processing apparatus 32/34 is eliminated. Thus, the problem of a long supply time of cassette 40 to be processed to processing apparatus 32/34 due to the increase in the standby time of cassette 40 for a transportation task and delay of an available space at cassette stage 172/182 is eliminated.

There will be no longer processed cassette 40 left at cassette stage 172/182 of processing apparatus 32/34. Cassette stage 172/182 quickly becomes available after the process, so that a new cassette 40 to be processed is supplied from stocker 190 without delay.

Figure 13:
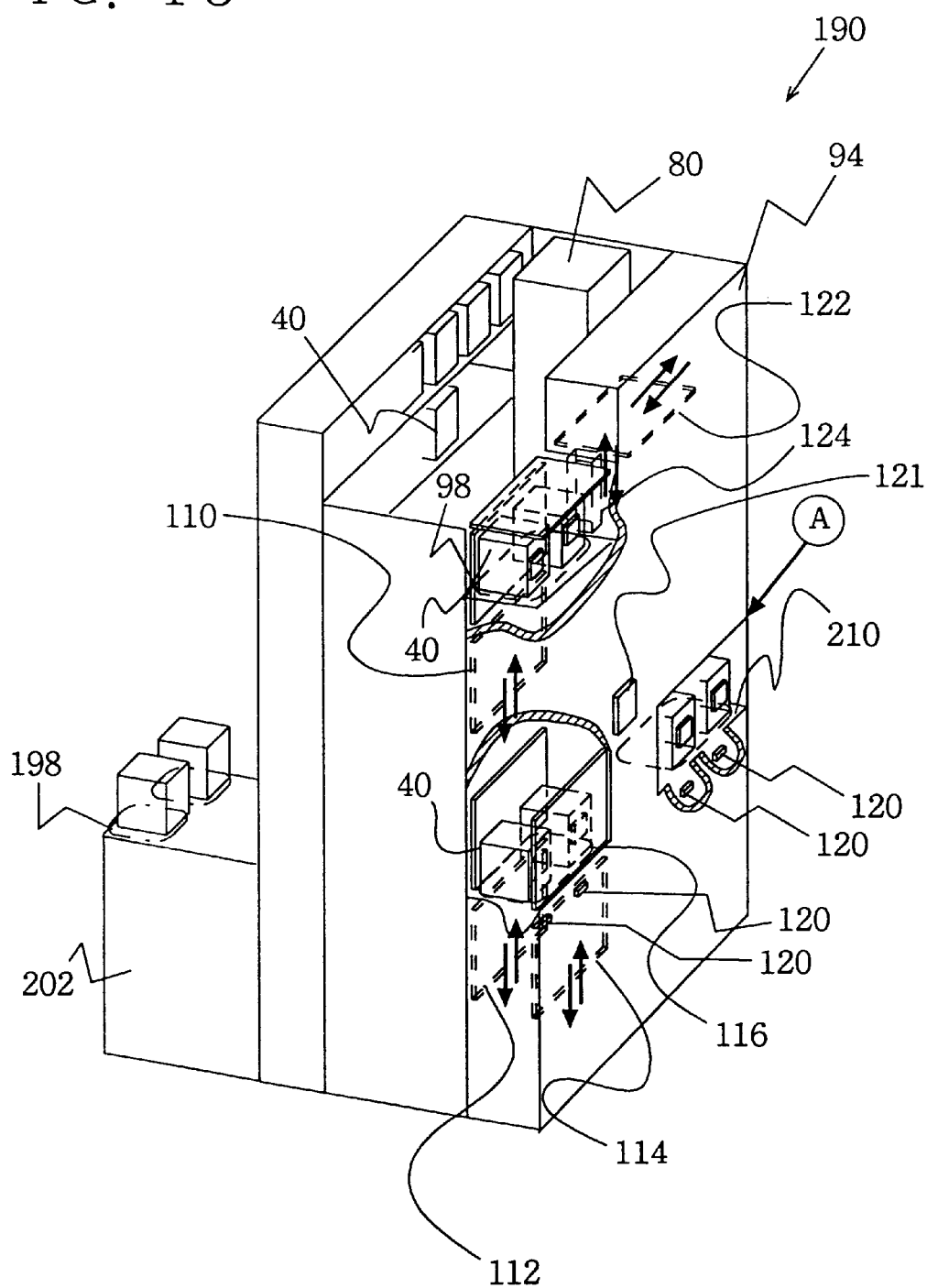
Figure 15:
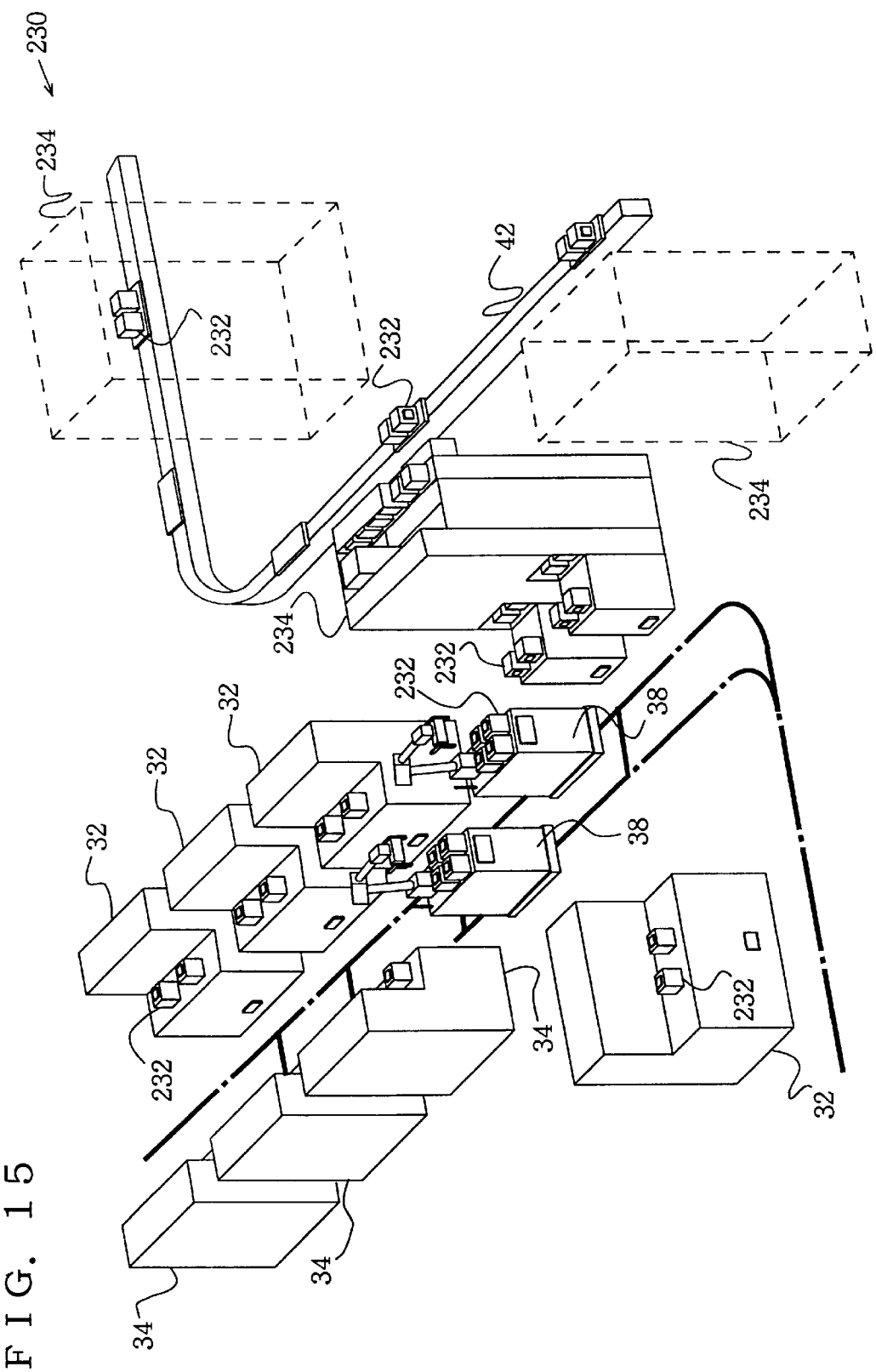
FIGS. 15 and 16 are bird's eye views of a conventional semiconductor wafer cassette transportation apparatus 230.
Figure 16:
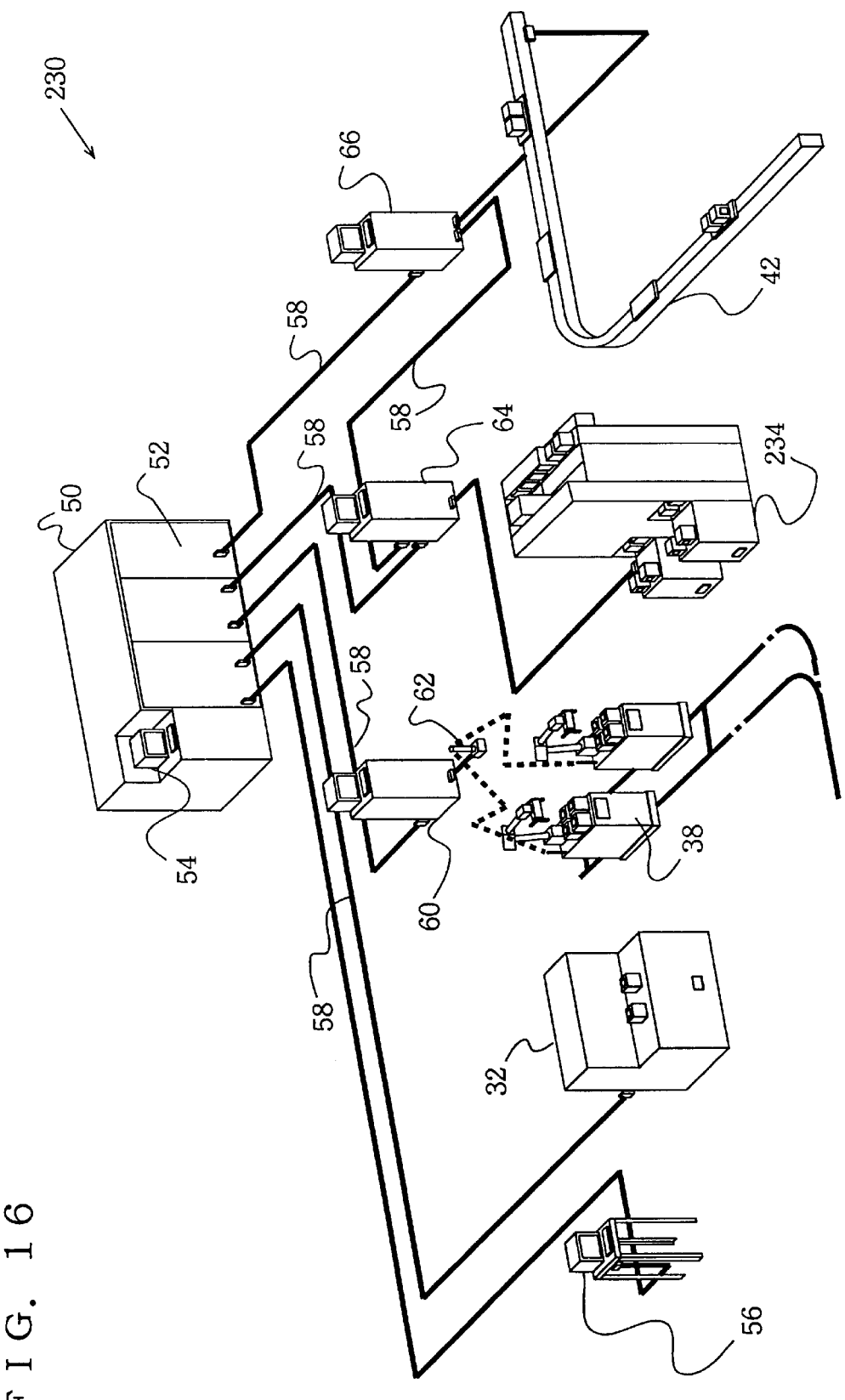
Figure 17A:
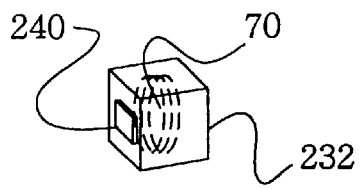
FIGS. 17A, 17B and 17C are diagrams for describing a semiconductor wafer cassette 230 and an ID card 240.
Figure 17B:
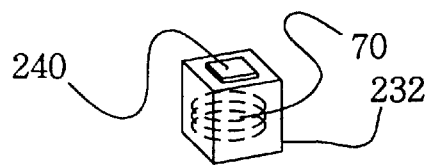
Figure 17C:
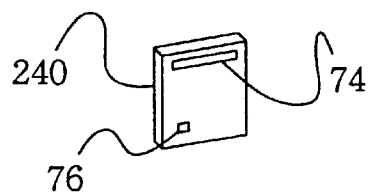
Figure 20:
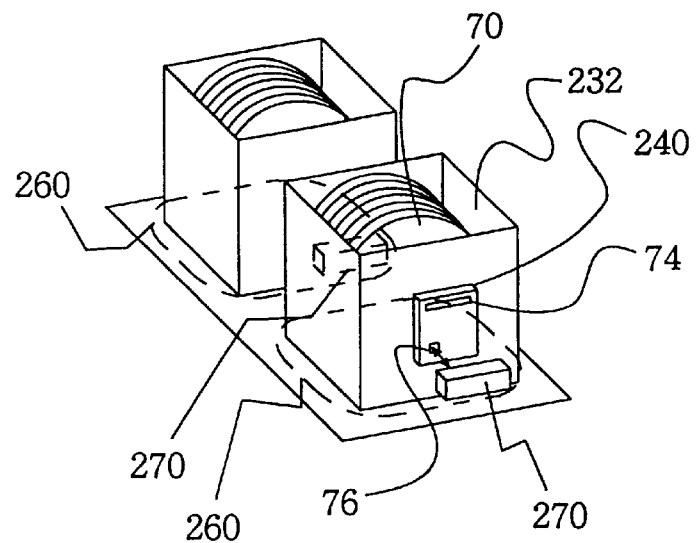
FIG. 20 is a diagram for describing an outlet port for manual output.
Figure 18:
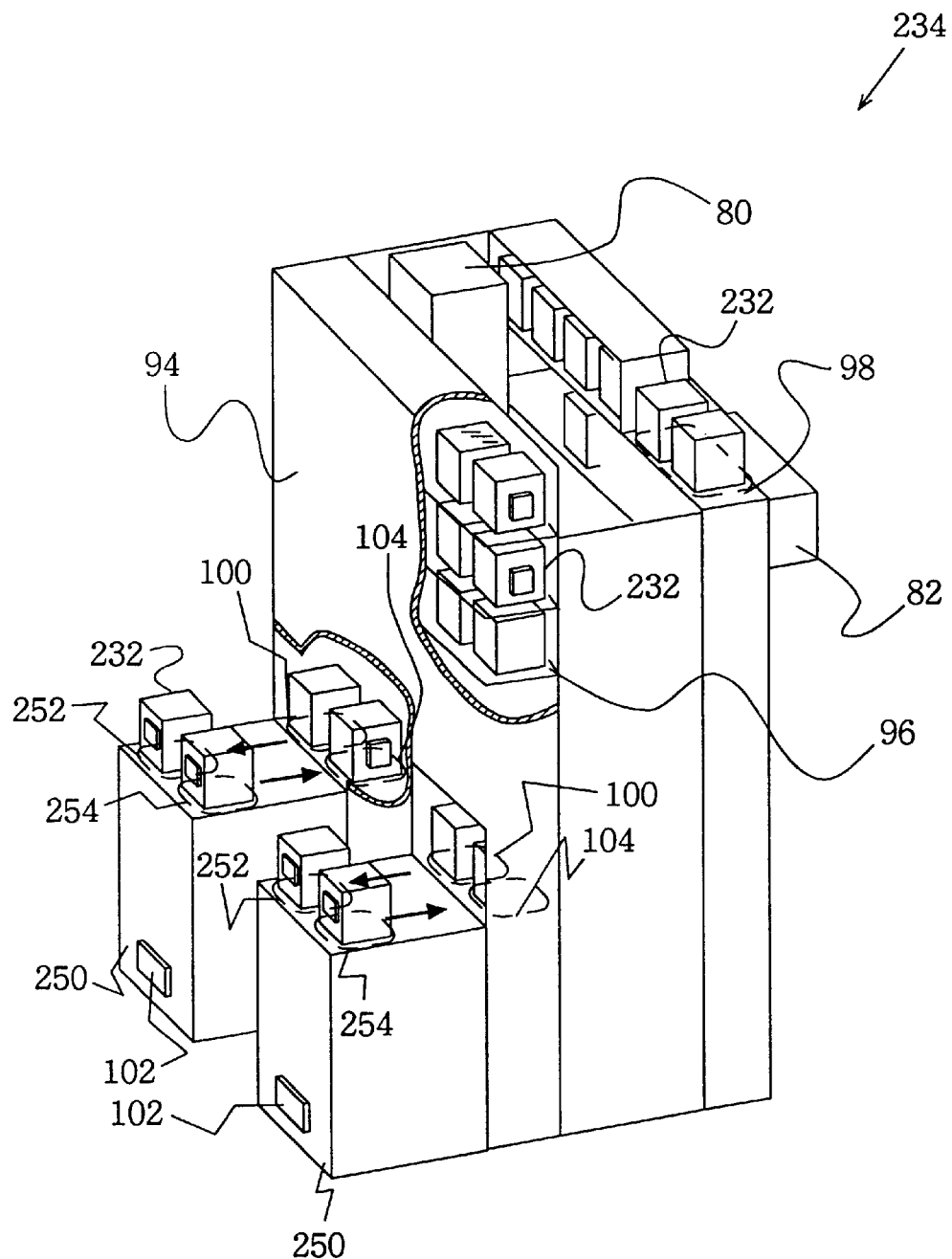
FIGS. 18 and 19 show a stocker 230 viewed from an automatic carrier side and an operator side, respectively.
Figure 19:
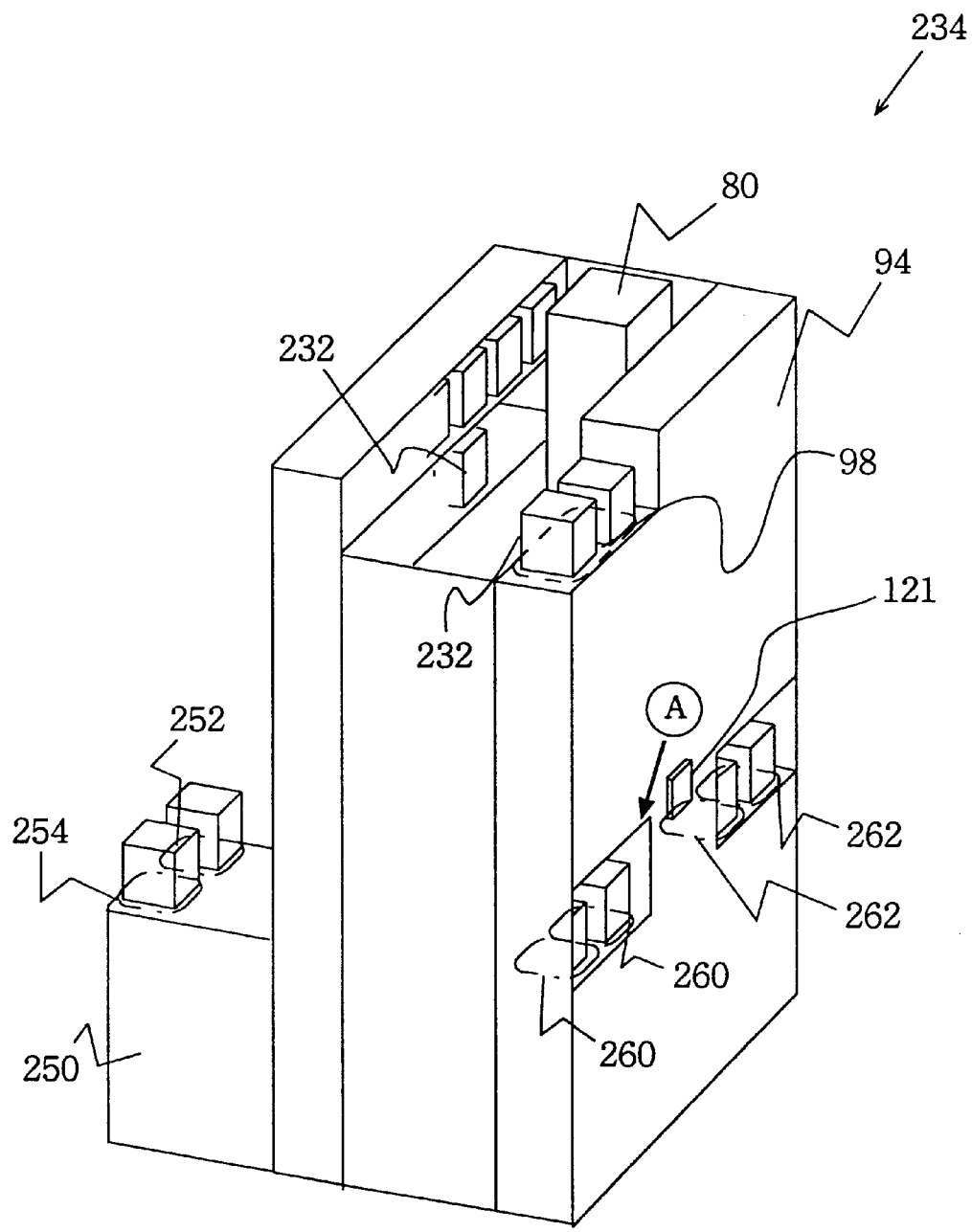

Referring to FIG. 13, stocker 190 further includes an outlet port 210 for manual output, similar to outlet port 118 of stocker 36. It is to be noted that, in stocker 190, the number of cassettes 40 that can be mounted on port 210 is set to be identical to the maximum number of cassettes requested to be handed over by processing apparatus 32/34. Here, two cassettes can be mounted at outlet port 210.

Consider the operation of stocker 190 and processing apparatus 32/34 that processes cassette 40 output from stocker 190 when no automatic carrier 38 is provided. A cassette load request is sent from processing apparatus 32/34 to host computer 50 via communication cable 58. Here, processing apparatus 32/34 sends out the load request of cassette 40 for every two cassettes. Host computer 50 receiving a cassette load request interrogates stocker 190 whether there is a cassette 40 to be processed for processing apparatus 32/34. When there are two or more cassettes to be processed, the number of cassette 40 is set to 2. Then, an exit task instruction of cassette 40 associated with outlet port 210 is sent to stocker controller 64.

Upon receiving an exit task instruction, stocker controller 64 drives stocker crane 80 to sequentially carry the two cassettes 40 to outlet port 210 corresponding to two mounting points of cassette 40. Stocker controller 64 provides a display on operation panel 121 of stocker 190 permitting output of cassette 40 on outlet port 210. The operator reading this message takes the two cassettes 40 from outlet port 210 and operates operation panel 121 to notify to stocker 190 that the unload operation is completed. In response, stocker 190 determines that the exit task is completed. An exit task complete report is sent to host computer 50 via communication cable 58. The operator unloading cassette 40 approaches terminal 56 of host computer 50 to detect the processing apparatus 32/34 that has issued the load request. Upon identifying processing apparatus 32/34, the operator carries cassette 40 to cassette stage 172/182 of the appropriate processing apparatus 32/34.

By setting the number of cassettes 40 that can be mounted on outlet port 210 identical to the number of cassettes 40 requested to be loaded from processing apparatus 32/34, the series of tasks such as the exit task of cassette 40 from the storage site in stocker 190 to outlet port 210 and the transportation task of cassette 40 from outlet port 210 to cassette stage 172/182 of processing apparatus 32/34 can be carried out in the unit of the number of cassettes 40 requested to be loaded by processing apparatus 32/34. Therefore, the problem of, when the number of cassettes requested to be loaded by processing apparatus 32/34 is greater than the number of cassettes that can be mounted at outlet port 210, the number of cassettes 40 greater than the number of cassettes that can be loaded being deferred for a subsequent exit task to degrade the operability of the operator is eliminated.

Thus, the standby time of the operator can be reduced. Also, the time required to supply cassette 40 to an appropriate processing apparatus 32/34 can be reduced.

As shown in FIGS. 4 and 5, stocker 36 includes an outer shield door 122 at the side of inter-stocker transport device 42 for port 98 and an elevator 124 for ascending/descending port 98. Stocker 36 also includes an outer shield door 90 at the automatic carrier 38 side for outlet delivery port 192 and inlet delivery port 194, and an outer shield door 114 at the operator's side with respect to inlet port 116 and outlet port 210.

The operation of these shield doors will be described hereinafter. It is to be noted that all these shield doors are closed when an operation by stocker 36 is not carried out.

The operation of outer shield door 90 for the automatic carrier related port will be first described. When a load request of cassette 40 is issued from processing apparatus 32/34, host computer 50 searches for a cassette 40 that is to be processed from the stored cassettes 40 in stocker 36. An exit task instruction with respect to the relevant cassette 40 is issued to stocker 36. Upon receiving an exit task instruction, stocker controller 64 drives stocker crane 80 to transfer cassette 40 on stocker shelf 96 to outlet delivery port 100. Then, stocker controller 64 drives forward translate device 84 so that cassette 40 is shifted from outlet delivery port 100 to outlet port 86. Since outer shield door 90 is closed at this time, shield door 90 is moved downwards to open. Then, cassette 40 is transferred to outlet port 86. After this shifting task is completed, stocker controller 64 causes outer shield door 90 to ascend, whereby port outer shield door 90 is closed. Thus, the series of the outlet task is completed. Stocker controller 64 sends a task complete report to host computer 50.

When cassette 40 is to be input through inlet port 88, stocker controller 64 responds to an entry task instruction from host computer 50 to drive forward translate device 84 so that cassette 40 on inlet port 88 is transferred to inlet delivery port 104. Since outer shield door 90 is closed at this time, shield door 90 is first moved downwards. Then, cassette 40 is transferred to inlet delivery port 104. When this shifting task is completed, stocker controller 64 moves outer shield door 90 upwards to be closed. When this task is completed, stocker controller 64 drives stocker crane 80 to store cassette 40 onto stocker shelf 96. When this task is completed, a task complete report is sent to host computer 50.

The operation of outer shield door 114 will be described. When a load request is issued from processing apparatus 32/34, host computer 50 searches for a cassette 40 to be processed from cassettes 40 stored in the relevant stocker 36. Then, an exit task instruction is sent to stocker 36. Upon receiving an exit task instruction, stocker controller 64 drives stocker crane 80 to carry cassette 40 on stocker shelf 96 to outlet port 118. Then, a display is provided on operation panel 121 of stocker 36 permitting unloading of cassette from outlet port 118.

The operator reading this message manipulates operation panel 121 to open outer shield door 114. In response to this operation, stocker controller 64 moves outer shield door 114 downwards to open. Then, the operator unloads cassette 40 from the port. The operator manipulates operation panel 121 again to raise shield door 114 to be closed. Thus, the series of the exit task is completed. Stocker controller 64 sends a task complete report to host computer 50 via communication cable 58.

When the operator is to enter a cassette 40 into stocker 36 through inlet port 116, the operator manipulates operation panel 121 to move downwards outer shield field 114 to open. Stocker controller 64 provides a display on operation panel 121 indicating that cassette 40 may be placed on inlet port 116. The operator reading this message loads cassette 40 on port 116, and then manipulates operation panel 121 again. In response to this manipulation, stocker 36 detects that cassette 40 is placed on inlet port 116, whereby outer shield door 114 ascends to be closed. The information stored in ID card 72 of the relevant cassette 40 is read out by ID card reader/writer 120. The read out data is sent to host computer 50 via communication cable 58. In response, host computer 50 detects that an operator has carried cassette 40. Host computer 50 sends an entry task instruction of that cassette 40 to stocker 36. Stocker 36 drives stocker crane 86 to transfer cassette 40 on inlet port 116 to stocker shelf 96 to complete the entry task.

The operation of outer shield door 122 will be described hereinafter. Cassette 40 from source stocker 36 is carried on carriage 162 of inter-stocker transport device 42 to approach port 98. When carriage 162 arrives at port 98, inter-stocker transport device controller 66 sends a request to stocker controller 64 via communication cable 58 so that cassette 40 on carriage 162 is to be placed on port 98.

Stocker 36 receiving this request laterally moves outer shield door 122 to be opened, and then drives elevator 124 to raise port 98. When this elevation task is completed, stocker controller 64 drives transfer device 82 so that cassette 40 on carriage 162 is transferred to port 98. Then, stocker controller 64 drives elevator 124 so that port 98 on which cassette 40 is mounted is moved downwards. When this shifting operation is completed, stocker controller 64 closes outer shield door 122 and drives stocker crane 80 to transfer cassette 40 onto stocker shelf 96. When this series of task is completed, stocker controller 64 sends a task complete report to inter-stocker transport device controller 66 via communication cable 58. When cassette 40 stored in stocker 36 is to be unloaded onto carriage 162, stocker 36 responds to an instruction of inter-stocker transport device controller 66 to carry out an exit task using stocker crane 80, port outer shield door 122, and elevator 124, and transfer device 82 in a sequence opposite to that described above.

By providing an appropriate door at the perimeter of stocker 36 with respect to inlet delivery port 104, outlet delivery port 100, port 98, inlet port 116, and outlet port 118 to shield the outer atmosphere, the interior of stocker 36 can be isolated from the exterior.

The conventional stocker 36 was open to the ambient environment through inlet delivery port 104, outlet delivery port 100, port 98, inlet port 116, and outlet port 118. There was a problem that dust and mist are introduced into stocker 36 to adhere to and degrade wafer 70 stored in cassette 40. However, the structure of the present invention provides the advantage that dust and mist will not enter stocker 36 to degrade wafer 70 in the stored cassette 40.

For the purpose of isolating the interior from the exterior, stocker 36 includes an outer shield door 122 at the side of inter-stocker transport device 42 and elevator 124 for port 98, an outer shield door 90 at the side of automatic carrier 38 for outlet delivery port 100 and inlet delivery port 104, and an outer shield door 114 for inlet and outlet ports 116 and 118. The interior of stocker 36 will communicate with the exterior when these shield doors are open to destroy the shielded state.

Stocker 36 shown in FIGS. 4–6 compensates for this problem as set forth in the following. Stocker 36 includes an inner shield door 110 at the side of stocker crane 80 in addition to outer shield door 122 and elevator 124. Stocker 36 also includes an inner shield door 92 at the stocker crane 80 side in addition to port outer shield door 90. Furthermore, stocker 36 includes an inner shield door 112 at the stocker crane 80 side in addition to port outer shield door 114.

The operation of these shield doors will be described briefly hereinafter. All these shield doors are closed when stocker 36 is not in operation.

The operation of inner shield door 92 will first be described. When a load request from processing apparatus 32/34 is provided, host computer 50 searches for a cassette 40 that is to be processed from cassettes 40 stored in relevant stocker 36. Then host computer 50 sends an exit task instruction to the relevant stocker 36. In response, stocker controller 64 opens port inner shield door 92 by causing it to descend. Then, stocker crane 80 carries cassette 40 on stocker shelf 96 to outlet delivery port 100. When the operation by stocker crane 80 ends, stocker controller 64 closes port inner shield door 92 by causing it to ascend. Then, stocker controller 64 opens outer shield door 90, and drives forward translate device 84 to shift cassette 40 from outlet delivery port 100 to outlet port 86.

When cassette 40 on inlet port 88 is to be entered, stocker controller 64 opens outer shield door 90 and drives forward translate device 84 so that cassette 40 on inlet port 88 is moved to inlet delivery port 104. When this transfer is completed, outer shield door 90 is closed. Then, stocker controller 64 moves inner shield 92 downwards to open. Stocker crane 80 transfers cassette 40 on inlet delivery port 104 to stocker shelf 96. When this transfer task is completed, stocker controller 64 closes port inner shield door 92 by raising the same. Thus, the series of the entry task from inlet port 88 is completed. By always having either inner shield door 92 or outer shield door 90 closed, communication between the interior and the exterior of stocker 36 can be completely inhibited.

The operation of inner shield door 112 will be described hereinafter. When a load request from processing apparatus 32/34 is provided, host computer 50 searches for a cassette 40 to be processed out of cassettes 40 stored in stocker 36. Then, an exit task instruction is issued to the relevant stocker 36. Upon receiving the exit task instruction, stocker controller 64 opens port inner shield door 112 by causing it to descend. Stocker crane 80 transfers cassette 40 on stocker shelf 96 to outlet port 118. Then, stocker controller 64 closes inner shield door 112. Next, a display is provided on operation panel 121 of stocker 36 permitting unloading of cassette 40 from outlet port 118. According to an operation through operation panel 121, stocker controller 64 opens outer shield door 114. The operator then unloads cassette 40 through this port.

When the operator enters a cassette 40 into stocker 36 through inlet port 116, stocker controller 64 responds to a manipulation of operation panel 121 by the operator to open outer shield door 114 and has cassette 40 placed on inlet port 116. Under the state where outer shield door 114 is closed, stocker controller 64 causes the information recorded on ID card 72 of cassette 40 placed on inlet port 116 to be read out by ID card reader/writer 120. The read out data is sent to host computer 50 via communication cable 58. Host computer 50 detects that cassette 40 has been carried by the operator according to this report and sends an entry task instruction of cassette 40 to stocker 36. In response, stocker controller 64 opens port inner shield door 112 by causing the same to descend. Stocker crane 80 is driven to transfer cassette 40 on inlet port 116 onto stocker shelf 96. When this storage task is completed, stocker controller 64 closes inner shield door 112 by raising the same. Thus the entry task through inlet port 116 is completed. By always having one of inner shield door 112 and outer shield door 114 closed, communication between the interior and the exterior of stocker 36 can be completely inhibited.

The operation of port inner shield door 110 will be described hereinafter. Cassette 40 carried on carriage 162 of inter-stocker transport device 42 from source stocker 36 is conveyed to port 98 through port outer shield door 122, elevator 124, and transfer device 82. Here, port 98 is located at the lower position, and port outer shield door 122 is closed. Inter-stocker transport device controller 66 opens port inner shield door 110 by causing the same to descend. Cassette 40 on port 98 is transferred onto stocker shelf 96 by stocker crane 80. When this storage task is completed, inter-stocker transport device controller 66 causes inner shield door 110 to return to its former position, i.e., the closed state. Thus, the series of the task is completed.

When cassette 40 in stocker 36 is to be unloaded onto carriage 162, cassette 40 is transferred through stocker crane 80, inner shield door 110, outer shield door 122, elevator 124, and transfer device 82 in a sequence opposite to that described above. By setting one of inner shield door 110 and outer shield door 122 always closed, communication between the interior and the exterior of stocker 36 can be completely inhibited.

By providing doors at the outer side and the inner side of stocker 36 with respect to port 104, outlet delivery port 100, port 98, inlet port 116, and outlet port 118, the interior of stocker 36 can be completely isolated from the exterior.

The conventional problem of dust and mist entering stocker 36 to degrade wafer 70 in the stored cassette 40 due to the communication with the atmosphere through inlet delivery port 104, outlet delivery port 100, port 98, inlet port 116, and outlet port 118 is eliminated.

Stockers 36 and 190 are provided with an ID card reader/writer 120 at outlet port 118 and outlet port 210, respectively, for reading data of ID card 72 attached to cassette 40.

ID card reader/writer 120 attached to outlet port 118 will be described hereinafter. The case is considered of the operation of stocker 36 and processing apparatus 32/34 that will apply a process on cassette 40 output from stocker 36 when automatic carrier 38 is not provided. When a cassette load request from processing apparatus 32/34 is provided to host computer 50 via communication cable 58, host computer 50 searches for a cassette 40 that can be processed in stocker 36. The exit task is initiated when there is a cassette 40. Host computer 50 in the exit task phase sends a transportation task instruction of cassette on stocker shelf 96 onto outlet port 118 to stocker 36 via communication cable 58.

Stocker 36 receiving a transportation task instruction drives stocker crane 80 to transfer cassette 40 to outlet port 118. Stocker 36 has the data recorded in ID card 72 of cassette 40 read out using ID card reader/writer 120 attached at outlet port 118. The read out information is sent to host computer 50 via communication cable 58.

Upon receiving this report, host computer 50 compares cassette 40 unloaded on outlet port 118 with cassette 40 corresponding to an exit task instruction to confirm whether they are identical. Then, an ID card write task instruction is sent to stocker 36 via communication cable 58 to have the name of the next processing apparatus 32/34 written into ID card 72.

Stocker 36 receiving the ID card write task instruction sends the information to ID card reader/writer 120 to have the name of the subsequent processing apparatus 32/34 written into ID card 72 attached to cassette 40. ID card 72 having the name of the apparatus written provides a display of that name on its own display unit 74. When this writing operation is completed, a write task complete report is provided to host computer 50 in a route opposite to that described above.

Upon receiving the report, host computer 50 sends a task instruction to stocker 36 to permit an unload task of cassette 40 from outlet port 118 by an operator. Upon receiving the task instruction, stocker 36 provides a display on operation panel 121 of stocker 36 permitting unloading of cassette 40 from outlet port 118.

The operator reading this message unloads cassette 40 from outlet port 118 and manipulates operation panel 121 to notify stocker 36 that the unloading task is completed. In response, stocker 36 sends a complete report to host computer 50 via communication cable 58.

The operator unloading cassette 40 does not have to approach operator 56 to detect the processing apparatus 32/34 that issued the load request since the information is provided on display unit 74 of ID card 72. The operator can directly carry cassette 40 to relevant cassette stage 172/182 of the appropriate processing apparatus 32/34.

By attaching an ID card reader/writer 120 at outlet port 118 of stocker 36, host computer 50 can write the name of the subsequent processing apparatus 32/34 which is the destination of cassette 40 onto display unit 74 of the ID card 72 attached to that cassette 40.

Since the operator does not have to approach terminal 56 of host computer 50 to identify the destination processing apparatus 32/34, the time for the task operation is economized.

The operator can now directly carry cassette 40 to the appropriate processing apparatus 32/34 by checking the name provided on display unit 74 of ID card 72 attached to cassette 40.

ID card 72 has communication unit 76 disposed at the bottom plane thereof. By this arrangement, stocker 36 can have ID card reader/writer 120 disposed beneath cassette receiver 220 corresponding to the position of communication unit 76 of ID card 72 at inlet port 116 and outlet port 118. ID card reader/writer 120 communicates with communication unit 76 provided at the bottom of ID card 72 through a communication window 132 provided at cassette receiver 130. The arrangement of ID card reader/writer 120 below cassette receiver 220 provides the advantage that, when cassette 40 to be mounted on inlet port 116 or to be unloaded from outlet port 118 is oriented so that ID card 72 thereof faces the operator, ID card reader/writer 120 will not obstruct the loading or unloading of cassette 40 by the operator.

By arranging ID card reader/writer 120 at inlet port 116 or outlet port 118 beneath cassette receiver 220, the mounted orientation of cassette 40 can be set to face the operator. Furthermore, the mounting orientation of cassette 40 at stocker shelf 96, inlet delivery port 104, outlet delivery port 100, and port 98 can all be set to face outwards.

The problem of forward translate device 84 having to carry out a rotation task of cassette 40 during the transfer task due to the orientation of cassette 40 at inlet port 88 differing by 90° from the orientation of cassette 40 at inlet delivery port 104 is eliminated.

The similar problem of forward translate device 84 having to carry out a rotation task during the transfer task due to the orientation of cassette 40 at outlet port 86 differing by 90° from the orientation of cassette 40 at outlet delivery port 100 is also eliminated.

The conventional problem of having difficulty in confirming cassette 40 placed on inlet port 116 and outlet port 118 since ID card 72 of cassette 40 is not oriented facing the operator is solved.

The operator can now easily read the information provided on display unit 74 of ID card 72 of cassette 40 placed at inlet port 116 and outlet port 118. By setting the mounting orientation of cassette 40 on outlet delivery port 100 identical to that on outlet port 86 and cassette 40 on inlet delivery port 104 identical to that on inlet port 88, it is no longer necessary to rotate cassette 40 90° during the transfer task of cassette 40 between these ports by forward translate device 84.

The adherence of dust, mist, and the like onto the impurity wafer 70 may or may not become critical depending upon the processing step of cassette 40 in the semiconductor wafer cassette transportation apparatus. This means that the requirement associated with the storage environment of stocker 36 differs. A stocker 36 provided with and without outer shield door 90, port inner shield door 92, outer shield door 114, inner shield door 112, and outer shield door 122, and inner shield door 110 can both be prepared and used appropriately for storing a cassette 40 that is to be subjected to a fabrication processing step according to whether the requirement with respect to the storage environment is severe or not.

By using a stocker 36 of the type provided with or without a shield door for storing cassette 40 according to the step carried out by processing apparatus 32/34 on cassette 40, the requirement of a severe storage environment can be satisfied while minimizing the usage of the costly stocker 36 with the shield door.

In the fabrication process of a semiconductor device, there are several fabrication steps that must have the period of time after a certain step and before the next step and also the task environment therebetween critically controlled. The semiconductor wafer cassette transportation apparatus can employ both types of a stocker 36 with a shield door and a stocker 36 without a shield door in a mixed manner. Host computer 50 may be implemented to have the information of the fabrication process related to the period of time from the end of a certain process to the start of the next process and the task environment therebetween applied through terminal 54. A stocker 36 of the type with the shield door can be used in the fabrication process that is under severe control. Also, transportation control can be provided in which the transportation task between stockers using inter-stocker transport device 42 and between a stocker 36 and a processing apparatus 32/34 using an automatic carrier 38 is assigned higher priority so that it can be carried out more quickly than other fabrication steps.

Thus, stockers 36 of the type with and without a shield door can both be provided in a semiconductor wafer cassette transportation apparatus. Host computer 50 can appropriately use a stocker 36 with or without a shield door corresponding to the fabrication process. Also, transportation control can be provided with the priority of a task altered appropriately. It is therefore possible to satisfy the requirements with respect to the severe period of time for the transportation task and task environment while using an inter-stocker transport device 42 and an automatic carrier 38 as in other processing steps with the usage of costly stocker 36 with a shield door minimized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An automatic carrier control method employed in a semiconductor wafer cassette transportation apparatus including
    a stocker system for storing a plurality of semiconductor wafer cassettes,
    a processing apparatus for applying a process on said semiconductor wafer cassette,
    an automatic carrier for carrying out a transportation task of said semiconductor wafer cassette between said stocker and said processing apparatus,
    an inter-stocker transport device for carrying out a transportation task of said semiconductor wafer cassette between a source stocker and a destination stocker, and
    a host computer for providing control of said stocker, said inter-stocker transport device, said automatic carrier and said processing apparatus,
    wherein said stocker includes an automatic carrier related inlet port for entry of said semiconductor wafer cassette by said automatic carrier,
    said automatic carrier control method comprising the steps of:
        transporting said semiconductor wafer cassette from said processing apparatus to said automatic carrier related inlet port using said automatic carrier under control of said host computer,
        determining whether there is a preceding semiconductor wafer cassette at said automatic carrier inlet port, and
        when there is a preceding semiconductor wafer cassette at said automatic carrier related inlet port, waiting for a predetermined time for said preceding semiconductor wafer cassette to be entered.

2. The automatic carrier control method according to claim 1, further comprising the step of issuing an error when said preceding semiconductor wafer cassette is present at said automatic carrier related inlet port at an elapse of said predetermined time.

3. An automatic carrier control method employed in a semiconductor wafer cassette transportation apparatus including
    a stocker system for storing a plurality of semiconductor wafer cassettes,
    a processing apparatus for applying a process on said semiconductor wafer cassette,
    an automatic carrier for carrying out a transportation task of said semiconductor wafer cassette between said stocker and said processing apparatus,
    an inter-stocker transport device for carrying out a transportation task of a semiconductor wafer cassette between a source stocker and a destination stocker, and
    a host computer for providing control of said stocker, said inter-stocker transport device, said automatic carrier, and said processing apparatus,
    wherein said stocker includes an automatic carrier related outlet port for exit of said semiconductor wafer cassette by said automatic carrier,
    wherein said host computer stores data of the number of transportation tasks currently carried out by said automatic carrier and an upper limit value,
    said automatic carrier control method comprising the steps of:

updating data of said number of transportation tasks currently carried out, and sending a transportation task instruction to said automatic carrier in a range where said number of transportation tasks currently carried out does not exceed said upper limit value.

4. The automatic carrier control method according to claim 3, further comprising the steps of:

estimating exit of said semiconductor wafer cassette from said automatic carrier related outlet port, and sending a transportation task instruction to said automatic carrier according to the estimation.

5. The automatic carrier control method according to claim 4, further comprising the steps of:

having said automatic carrier determine whether there is a semiconductor wafer cassette on said automatic carrier related outlet port, when there is no semiconductor wafer cassette at said automatic carrier related outlet port, waiting for a predetermined time for a semiconductor wafer cassette to exit, and issuing an error when said semiconductor wafer cassette is not present at said automatic carrier related outlet port at an elapse of said predetermined time.

6. An automatic carrier control method employed in a semiconductor wafer cassette transportation apparatus including a stocker system for storing a plurality of semiconductor wafer cassettes, a processing apparatus for applying a process on said semiconductor wafer cassette, an automatic carrier for carrying out a transportation task of said semiconductor wafer cassette between said stocker and said processing apparatus, an inter-stocker transport device for carrying out a transportation task of said semiconductor wafer cassette between a source stocker and a destination stocker, and a host computer for providing control of said stocker, said inter-stocker transport device, said automatic carrier, and said processing apparatus, wherein said stocker includes an automatic carrier related outlet port for exit of said semiconductor wafer cassette by said automatic carrier, said automatic carrier control method comprising the steps of:

receiving a process complete report from said processing apparatus, carrying out an unload task to said automatic carrier related outlet port upon receiving said process complete report, and sending to said automatic carrier a transportation task instruction of a semiconductor wafer cassette processed by said processing apparatus and a semiconductor wafer cassette unloaded from said automatic carrier outlet port.

* * * * *